(12) United States Patent
Su et al.

(10) Patent No.: US 9,337,112 B2
(45) Date of Patent: *May 10, 2016

(54) SEMICONDUCTOR DEVICE HAVING TEST STRUCTURE

(71) Applicant: SAMSUNG ELECTRONICS CO., LTD., Gyeonggi-do (KR)

(72) Inventors: Ping Hsun Su, Gyeonggi-do (KR); Yoonhae Kim, Gyeonggi-do (KR); Hwasung Rhee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,603

(22) Filed: May 29, 2015

(65) Prior Publication Data

US 2016/0020159 A1    Jan. 21, 2016

Related U.S. Application Data

(62) Division of application No. 14/261,513, filed on Apr. 25, 2014, now Pat. No. 9,082,739.

(60) Provisional application No. 61/824,155, filed on May 16, 2013.

(30) Foreign Application Priority Data

Oct. 11, 2013  (KR) .......................... 10-2013-0121010

(51) Int. Cl.
*H01L 21/8234*  (2006.01)
*H01L 21/66*  (2006.01)

(52) U.S. Cl.
CPC ..................................... *H01L 22/34* (2013.01)

(58) Field of Classification Search
CPC .................... H01L 22/34; H01L 21/823431
See application file for complete search history.

(56) References Cited

U.S. PATENT DOCUMENTS

| 6,430,097 | B1 | 8/2002 | Itou |
| 6,980,475 | B2 | 12/2005 | Wake |
| 7,436,198 | B2 | 10/2008 | Lee |
| 8,125,007 | B2 | 2/2012 | Anderson et al. |

(Continued)

FOREIGN PATENT DOCUMENTS

| KR | 1020090098278 | 9/2009 |
| KR | 1020090098279 | 9/2009 |
| KR | 1020100013977 | 2/2010 |

*Primary Examiner* — Daniel Whalen
(74) *Attorney, Agent, or Firm* — F. Chau & Associates, LLC

(57) ABSTRACT

A semiconductor device is provided. First and second pads are electrically connected to a plurality of test structures. Each test structure includes an active region, active patterns, gate electrodes and an electrode pattern. The active region includes a rounded corner portion. The active patterns protrudes from the semiconductor substrate and extends in parallel in a first direction. The gate electrodes crosses over the active patterns in a second direction. One gate electrode is electrically connected to the first pad. The electrode pattern is disposed at a side of the gate electrode electrically connected to the first pad. The electrode pattern is electrically connected to the second pad. The electrode pattern crosses over the active patterns. An overlapping area of the electrode pattern and the active patterns in each test structure is different from an overlapping area of the electrode pattern and the active patterns in other test structures.

7 Claims, 31 Drawing Sheets

(56) References Cited

U.S. PATENT DOCUMENTS

| | | |
|---|---|---|
| 8,331,178 B2 | 12/2012 | Liu et al. |
| 8,395,224 B2 | 3/2013 | Becker et al. |
| 8,405,078 B2 | 3/2013 | Lee et al. |
| 9,082,739 B2 * | 7/2015 | Su .......................... H01L 22/34 |
| 2008/0273366 A1 | 11/2008 | Braceras et al. |
| 2011/0079855 A1 | 4/2011 | Chan et al. |
| 2011/0115024 A1 * | 5/2011 | Lee ................ H01L 21/823431 257/368 |
| 2011/0195564 A1 | 8/2011 | Liaw et al. |
| 2012/0278781 A1 * | 11/2012 | Wann .................. G06F 17/5068 716/122 |

* cited by examiner

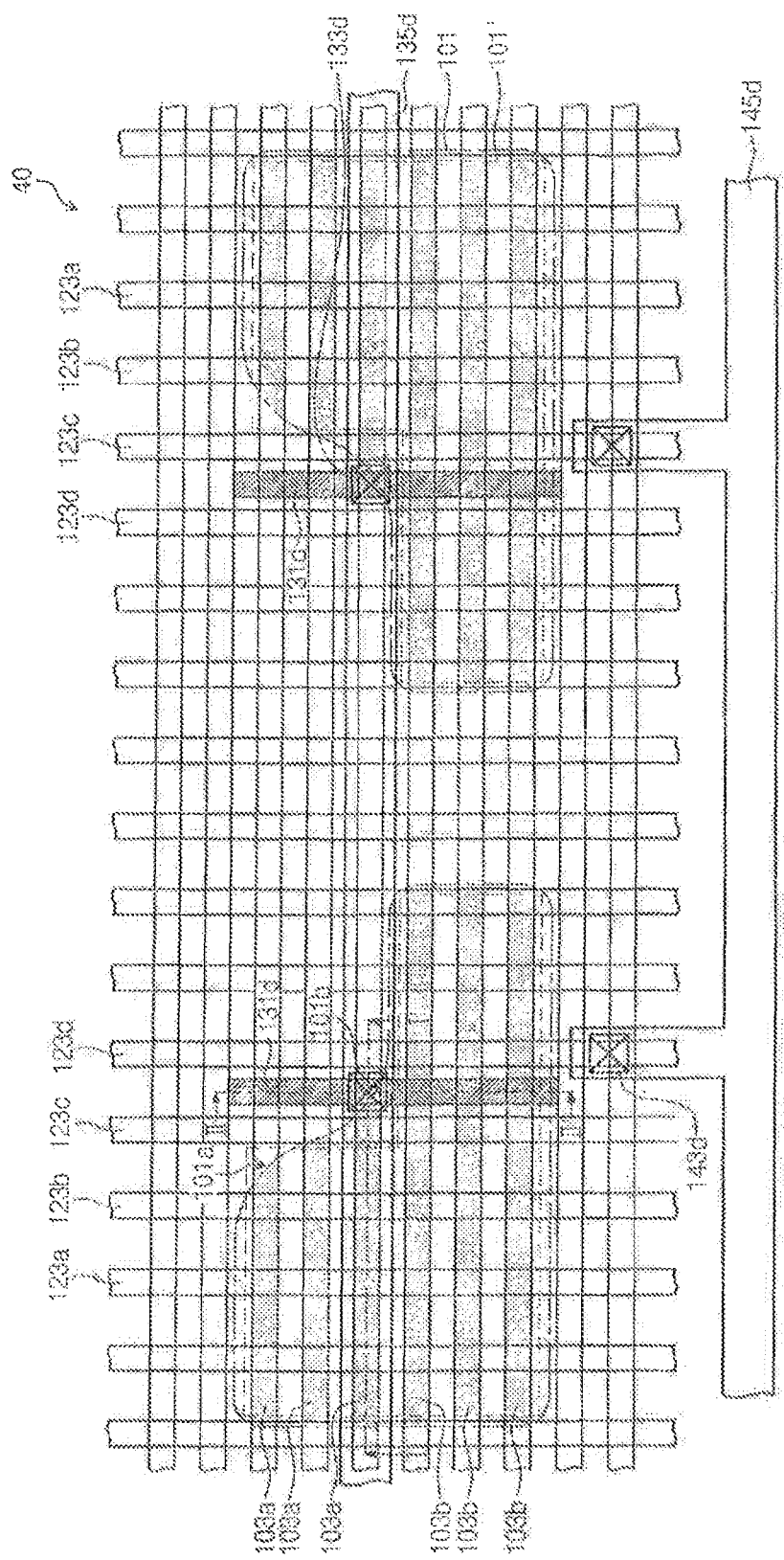

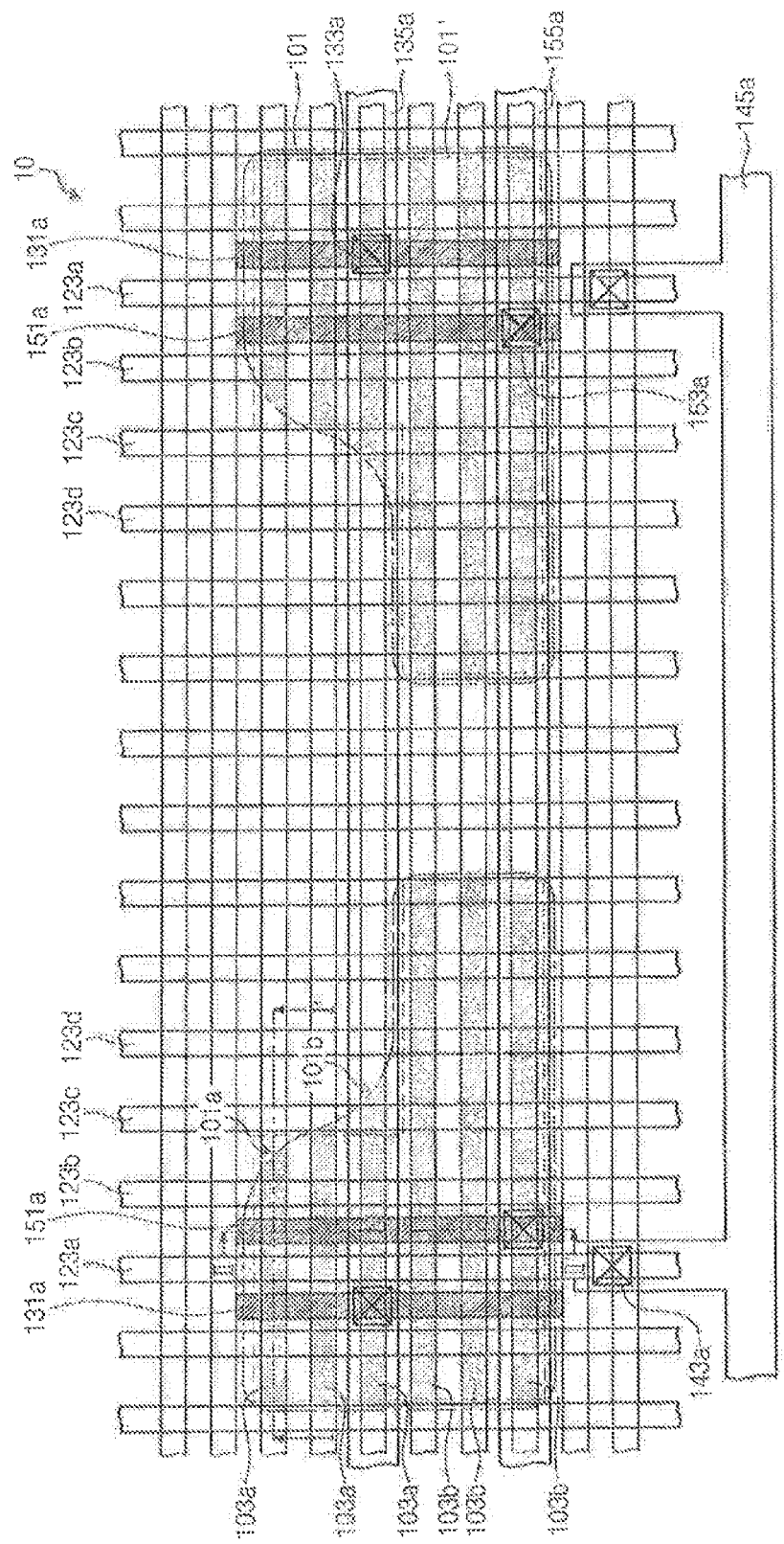

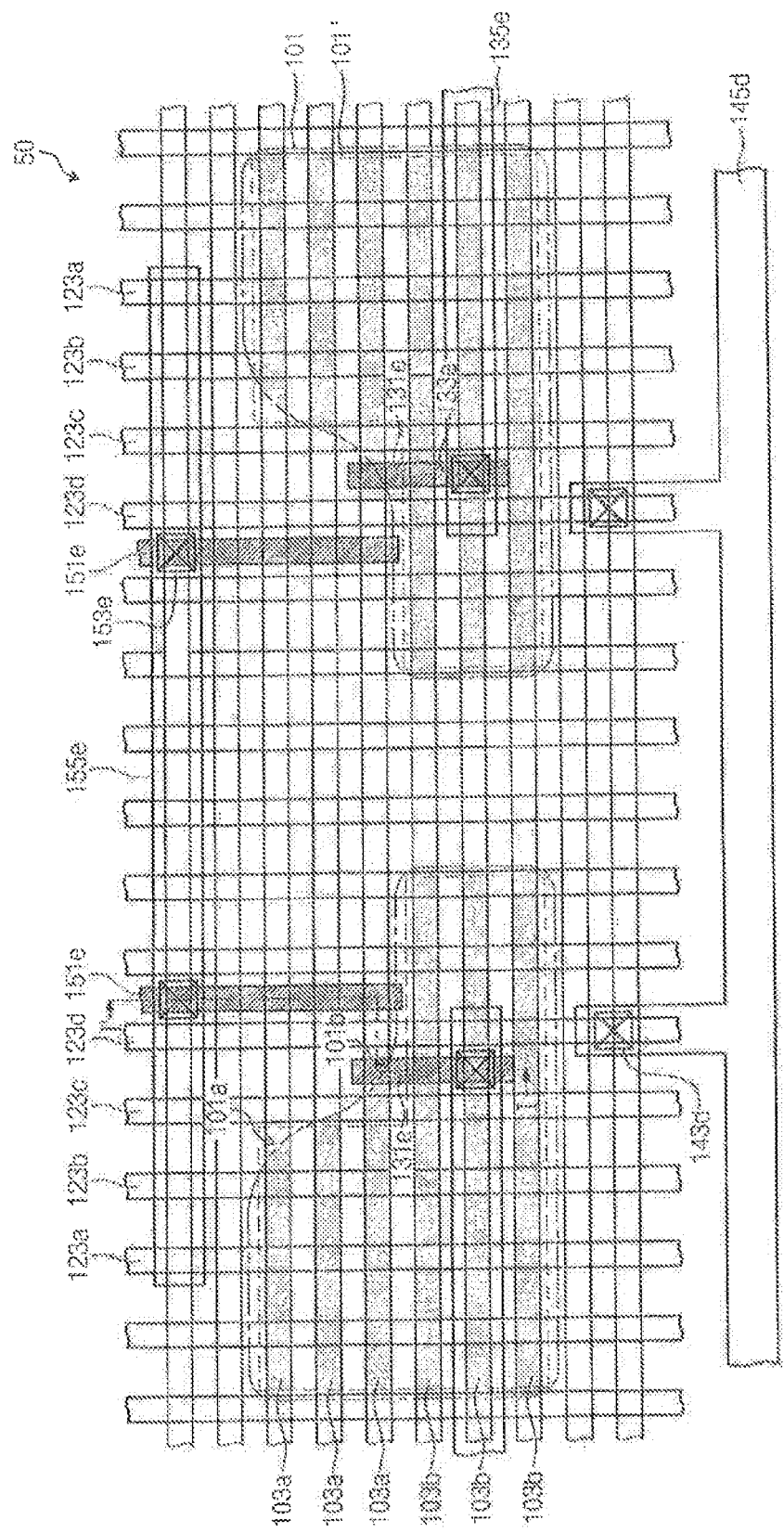

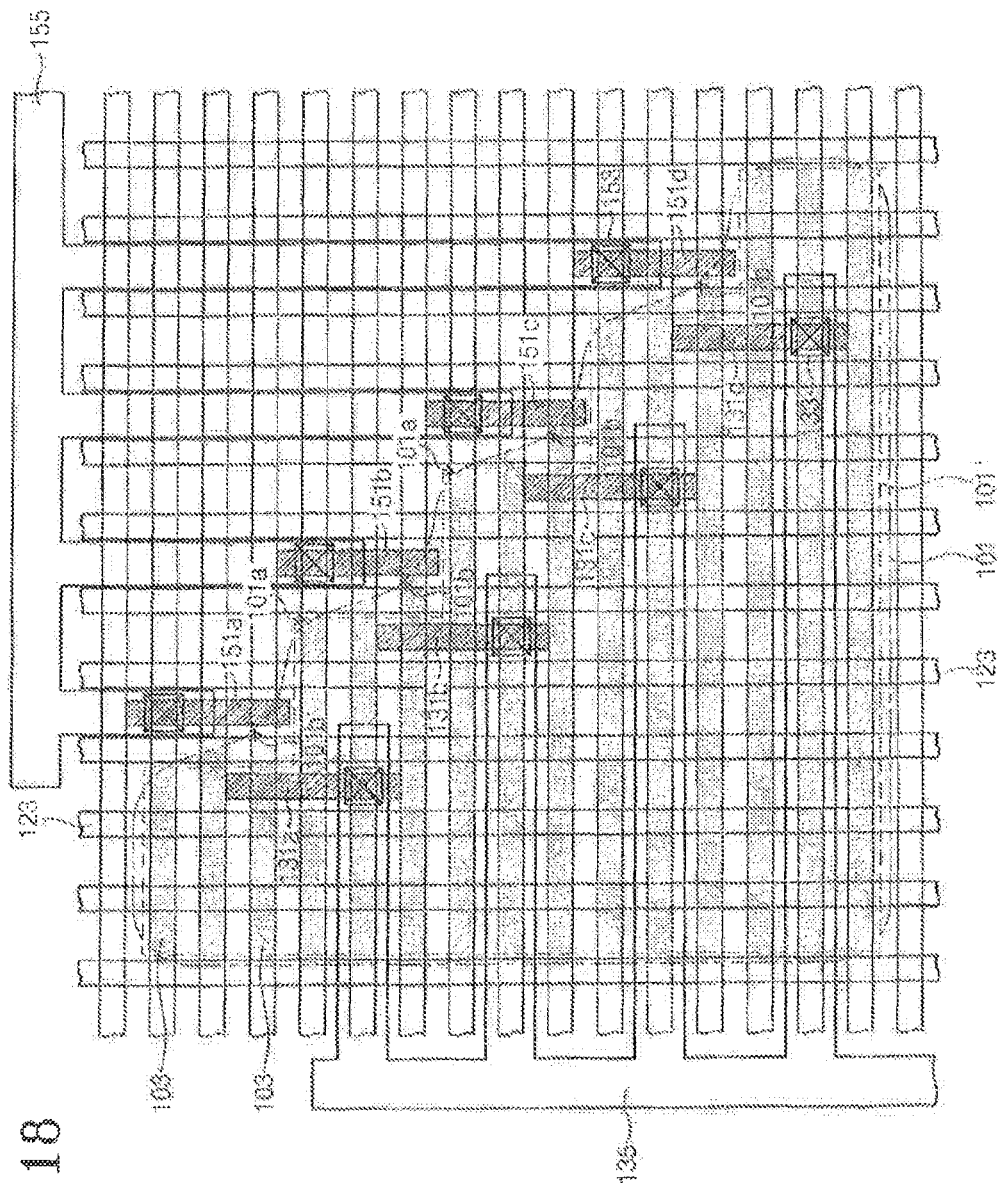

SEMICONDUCTOR DEVICE HAVING TEST STRUCTURE

CROSS-REFERENCE TO RELATED APPLICATIONS

This application is a divisional of U.S. application Ser. No. 14/261,513 filed on Apr. 25, 2014, which claims the benefit under 35 U.S.C. §119 to U.S. Provisional Application No. 61/824,155 filed on May 16, 2013 and claims priority under 35 U.S.C. §119 to Korean Patent Application No. 10-2013-0121010 filed on Oct. 11, 2013 in the Korean Intellectual Property Office, the disclosures of which are incorporated by reference herein in its entirety.

TECHNICAL FIELD

The present inventive concept relates to test structures of a semiconductor device.

DISCUSSION OF RELATED ART

Integrated circuit chips may be formed on a wafer to manufacture semiconductor devices. After the formation of the integrated circuit chips, electrical characteristics of the integrated circuit chips may be measured to confirm whether the integrated circuit chips are normally operated or not. Thus, test elements may be provided on the wafer.

SUMMARY

According to an exemplary embodiment of the present inventive concept, a semiconductor device is provided. The semiconductor device includes first and second pads, and a plurality of test structures. The first and second pads are disposed on a semiconductor substrate. The plurality of test structures is disposed on the semiconductor substrate. Each test structure includes an active region, a plurality of active patterns, a plurality of gate electrodes and an electrode pattern. The active region includes a rounded corner portion. The plurality of active patterns protrudes from the semiconductor substrate and extends in parallel in a first direction. The plurality of gate electrodes crosses over the active patterns in a second direction. One of the plurality of gate electrodes is electrically connected to the first pad. The electrode pattern is disposed at a side of the one of the plurality of gate electrodes. The electrode pattern is electrically connected to the second pad. The electrode pattern crosses over the plurality of active patterns. An overlapping area of the electrode pattern and the active patterns in each test structure is different from an overlapping area of the electrode pattern and the active patterns in other test structures.

According to an exemplary embodiment of the present inventive concept, a semiconductor device is provided. The semiconductor device includes first, second and third pads, a plurality of test structures. The first, second and third pads are disposed on a semiconductor substrate. The plurality of test structures is disposed on the semiconductor substrate. Each test structure includes an active region, a plurality of active patterns, a plurality of gate electrodes, and first and second electrode patterns. The active region includes a rounded corner portion. The plurality of active patterns protrudes from the semiconductor substrate and extends in parallel in a first direction. The plurality of gate electrodes crosses over the plurality of active patterns in a second direction. One of the plurality of gate electrodes is electrically connected to the first pad. The first and second electrode patterns are disposed on the active region. One of the plurality of gate electrodes is interposed between the first and second electrode patterns. The first and second electrode patterns are electrically connected to the second and third pads, respectively. An overlapping area of the second electrode pattern and the plurality of active patterns in each test structure is different from an overlapping area of the second electrode pattern and the plurality of active patterns in other test structures.

According to an exemplary embodiment of the present inventive concept, a semiconductor device is provided. A semiconductor substrate includes a plurality of active regions having rounded corner portions. A plurality of gate electrodes crosses over each active region. A plurality of first electrode patterns and a plurality of second electrode patterns are connected to each active region. One of the plurality of gate electrodes is interposed between one of the plurality of first electrode patterns and one of the plurality of second electrode patterns. An overlapping area of one of the plurality of active regions and one of the plurality of second electrode patterns corresponding thereto is different from an overlapping area of another of the plurality of active regions and one of the plurality of second electrode patterns corresponding thereto.

BRIEF DESCRIPTION OF THE DRAWINGS

These and other features of the inventive concept will become more apparent by describing in detail exemplary embodiments thereof with reference to the accompanying drawings of which:

FIGS. 6A to 9A are plan views illustrating a test structure of a semiconductor device according to an exemplary embodiment of the inventive concept;

FIGS. 6B to 9B are cross-sectional views taken along lines I-I' and II-II' of FIGS. 6A to 9A to illustrate a test structure of a semiconductor device according to an exemplary embodiment of the inventive concept;

FIGS. 10A to 12A are plan views illustrating a test structure of a semiconductor device according to an exemplary embodiment of the inventive concept;

FIGS. 10B to 12B are cross-sectional views taken along lines I-I' and II-II' of FIGS. 10A to 12A to illustrate a test structure of a semiconductor device according to an exemplary embodiment of the inventive concept;

FIGS. 13A to 17A are plan views illustrating a test structure of a semiconductor device according to an exemplary embodiment of the inventive concept;

FIGS. 13B to 17B are cross-sectional views taken along lines I-I' and II-II' of FIGS. 13A to 17A to illustrate a test structure of a semiconductor device according to an exemplary embodiment of the inventive concept; and FIG. 18 is a plan view illustrating a test structure of a semiconductor device according to an exemplary embodiment of the inventive concept.

DETAILED DESCRIPTION OF EXEMPLARY EMBODIMENTS

Figure 1:
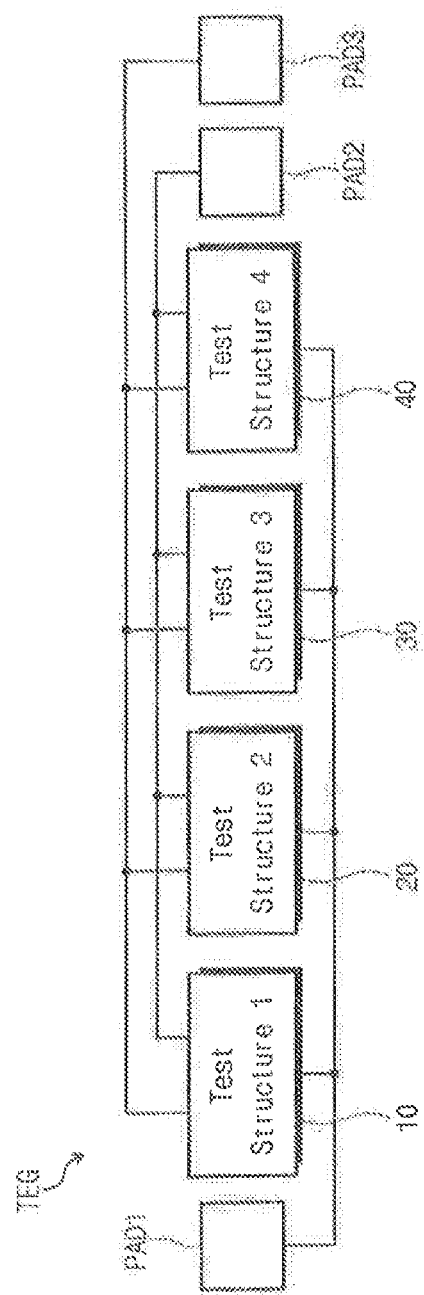
FIG. 1 is a schematic diagram illustrating a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2A:
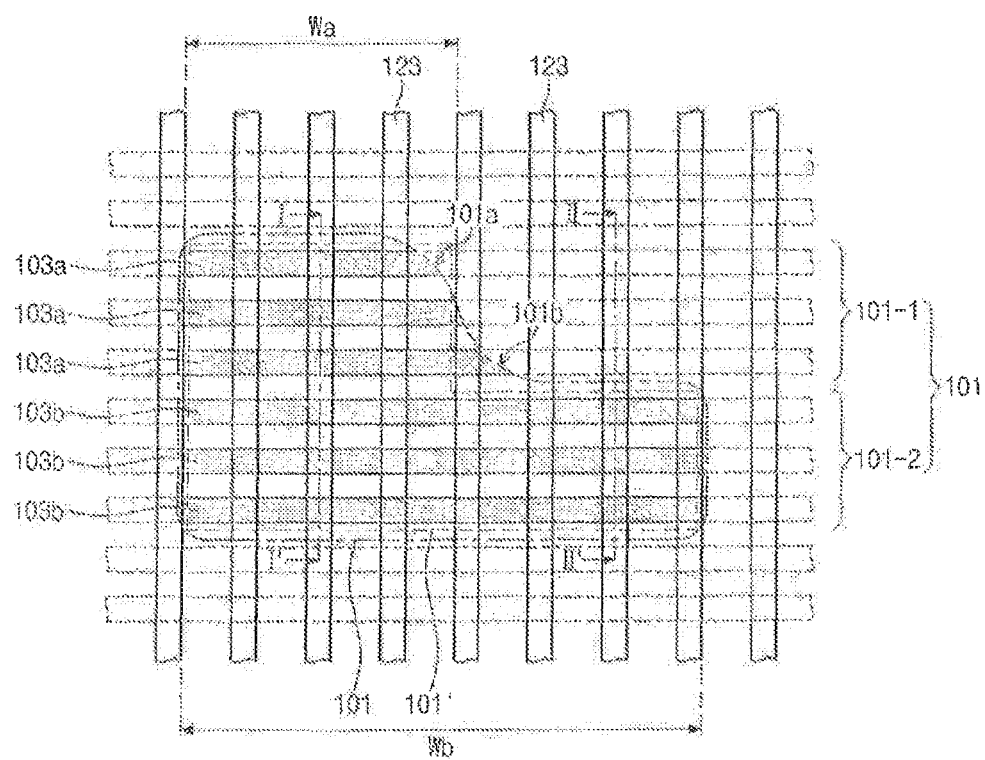
FIG. 2A is a plan view illustrating a portion of a test structure of a semiconductor device according to an exemplary embodiment of the inventive concept.
Figure 2B:
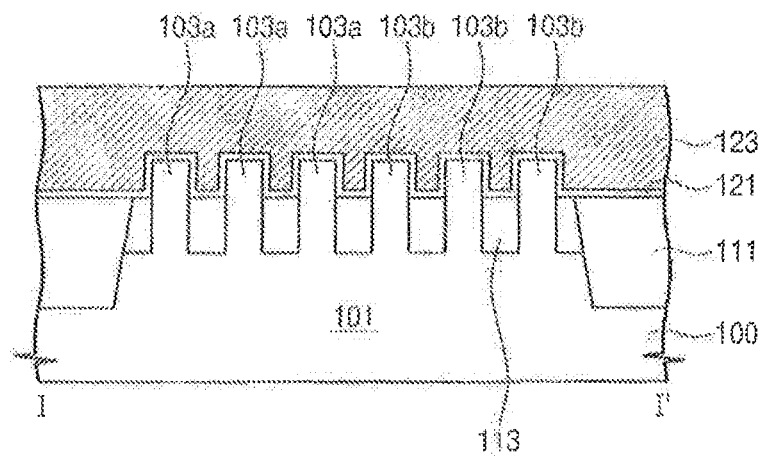
FIGS. 2B and 2C are cross-sectional views taken along lines I-I' and II-II' of FIG. 2A to illustrate a portion of a test structure of a semiconductor device according to an exemplary embodiment of the inventive concept.
Figure 2C:
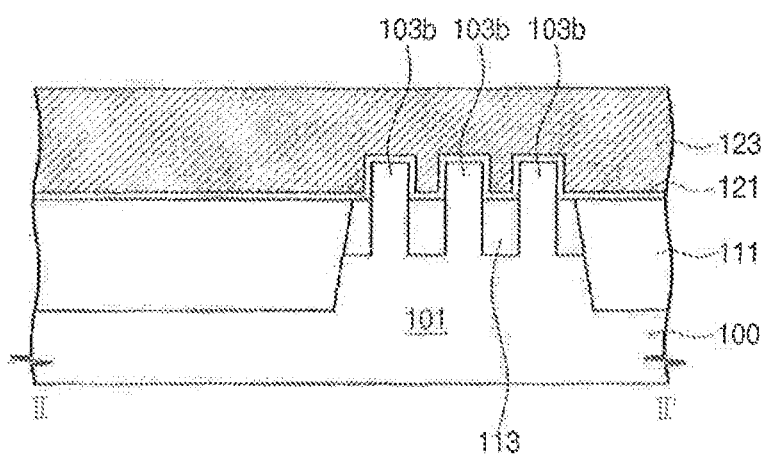

FIG. 1 is a schematic diagram illustrating a semiconductor device according to an exemplary embodiment of the inventive concept. FIG. 2A is a plan view illustrating a portion of a test structure of a semiconductor device according to an exemplary embodiment of the inventive concept. FIGS. 2B and 2C are cross-sectional views taken along lines I-I' and II-II' of FIG. 2A to illustrate a portion of a test structure of a semiconductor device according to an exemplary embodiment of the inventive concept.

Referring to FIG. 1, the semiconductor device includes a test element group TEG for evaluating electrical characteristics of a semiconductor element. The test element group TEG includes a plurality of test structures 10, 20, 30 and 40 and a plurality of test pads PAD1, PAD2 and PAD3. Each of the test pads PAD1, PAD2 and PAD3 is commonly connected to the test structures 10, 20, 30 and 40 through a conductive line.

The test structures 10, 20, 30 and 40 may include semiconductor elements having the same structure as each other. Each of the test structures 10, 20, 30 and 40 may include test patterns for detecting electrical characteristics of the semiconductor elements therein, and the test patterns of the test structures 10, 20, 30 and 40 may be disposed at different positions from the semiconductor element. The electrical characteristics of the semiconductor elements may be different from each other due to the different positions of the test patterns in the test structures 10, 20, 30 and 40 with respect to the semiconductor element.

The semiconductor element may include a fin field effect transistor, for example. Referring to FIGS. 2A, 2B and 2C, a test structure includes an active region 101 defined by a device isolation layer 111, and active patterns 103a and 103b disposed in the active region 101. The active patterns 103a and 103b protrudes from the active region 101 in the semiconductor substrate 100 and extends in parallel along the direction perpendicular to the cross section shown. Gate electrodes 123 are disposed on the semiconductor substrate 100 and cross over the active patterns 103a and 103b. A gate insulating layer 121 is disposed between the gate electrodes 123 and the active patterns 103a and 103b. The gate insulating layer 121 covers upper portions of the active patterns 103a and 103b. Source/drain dopant regions are disposed in the active patterns 103a and 103b at both sides of each gate electrode 123.

Referring to FIG. 2A, the active region 101 includes a first active region 101-1 having a first width Wa and a second active region 101-2 having a second width Wb greater than the first width Wa. The first and second widths Wa and Wb are measured along the direction in which the active patterns 103a and 103b extend in parallel to each other. The active region 101 is defined by the device isolation layer 111. The active region 101 includes corner portions 101a and 101b which become rounded when the device isolation layer 111 is formed. For example, the active region 101 defined in the semiconductor substrate 100 has the rounded corner portions 101a and 101b compared to an ideal active region 101' (i.e., a mask pattern for defining the active region 101). For example, the active region 101 includes a first corner portion 101a reducing an area of the active region 101 and a second corner portion 101b increasing the area of the active region 101 by the corner rounding effect. An inflection point exists between the first corner portion 101a and the second corner portion 101b. For example, the active region 101 includes the first corner portion 101a reducing lengths of the active patterns 103a and 103b and the second corner portion 101a increasing lengths of the active patterns 103a and 103b as compared with ideal lengths of the active patterns 103a and 103b.

Active patterns 103a and 103b are disposed in the active region 101 and are extended in parallel along one direction. A fin insulating pattern 113 is disposed between the active patterns 103a and 103b. The fin insulating pattern 113 is disposed on the lower sidewalls of the active patterns 103 and 103b, and the upper sidewalls of the active patterns are not covered with the fin insulating pattern 113. For example, the top surface of the fin insulating pattern 113 is lower than the top surfaces of the active patterns 103a and 103b, and the upper sidewalls of the active patterns 103a and 103b are exposed. The top surface of the fin insulating pattern 113 is substantially coplanar with the top surface of the device isolation layer 111. Accordingly, the top surface of the device isolation layer 111 is lower than the top surfaces of the active patterns 103a and 103b. The bottom surface of the device isolation layer 111 is lower than the bottom surface of the fin insulating pattern 113.

The active patterns 103a and 103b are grouped into first active patterns 103a and second active patterns 103b according to their positions on the active region 101. The first active patterns 103a are disposed in the first active region 101-1, and the second active patterns 103b are disposed in the second active region 101-2. The first active patterns 103a are shorter than the second active patterns 103b. Here, the first active patterns 103a disposed within the ideal active region 101' are substantially equal to each other. However, since the active region 101 has the rounded corner portions 101a and 101b, the lengths of the first active patterns 103a in the first active region 101-1 are different from each other. The lengths of the second active patterns 103b disposed in a second region of the ideal active region 101' are substantially equal to each other. The corner portions 101a and 101b of the active region 101 are rounded, and the lengths of the first active patterns 103a disposed in the first active region 101-1 are different from each other.

Thus, an electrical characteristic of the fin field effect transistor adjacent to the corner portions 101a and 101b of the active region 101 may be different from an electrical characteristic of the fin field effect transistor disposed in a center portion of the active region 101 spaced apart from the device isolation layer 111. Additionally, the electrical characteristic of the fin field effect transistor adjacent to the corner portions 101a and 101b of the active region 101 may be varied depending on the radiuses of curvature of the corner portions 101a and 101b of the active region 101. Thus, the test structures 10, 20, 30 and 40 according to embodiments of the inventive concepts evaluate the electrical characteristic variation of the fin field effect transistor by the corner rounding of the active region 101.

Figure 3:
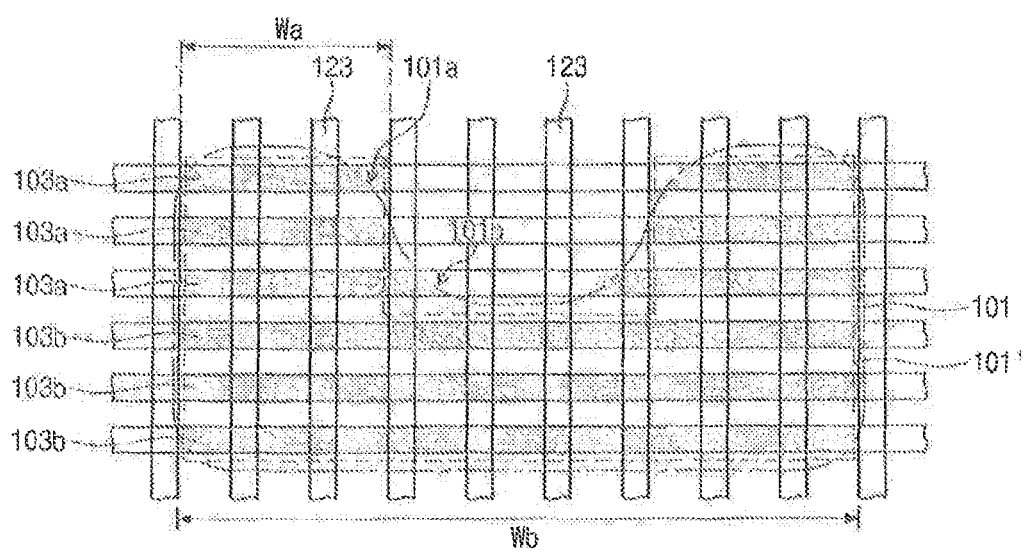
FIGS. 3 to 5 are plan views illustrating portions of test structures of a semiconductor device according to an exemplary embodiment of the inventive concept.
Figure 4:
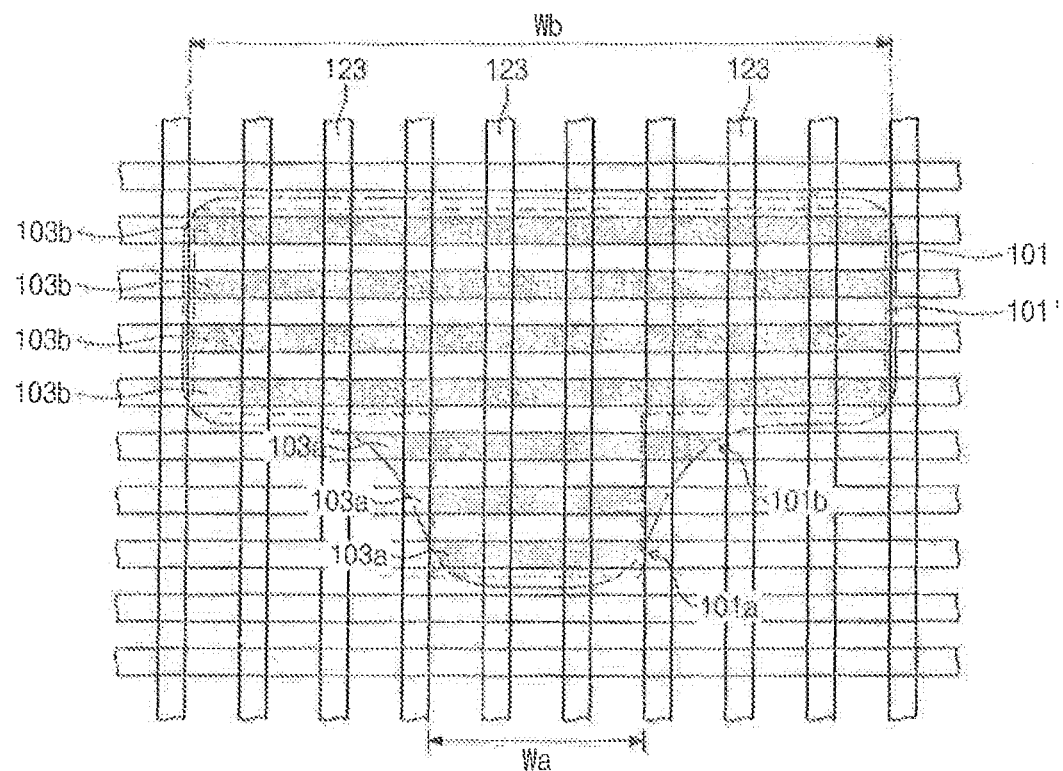
Figure 5:
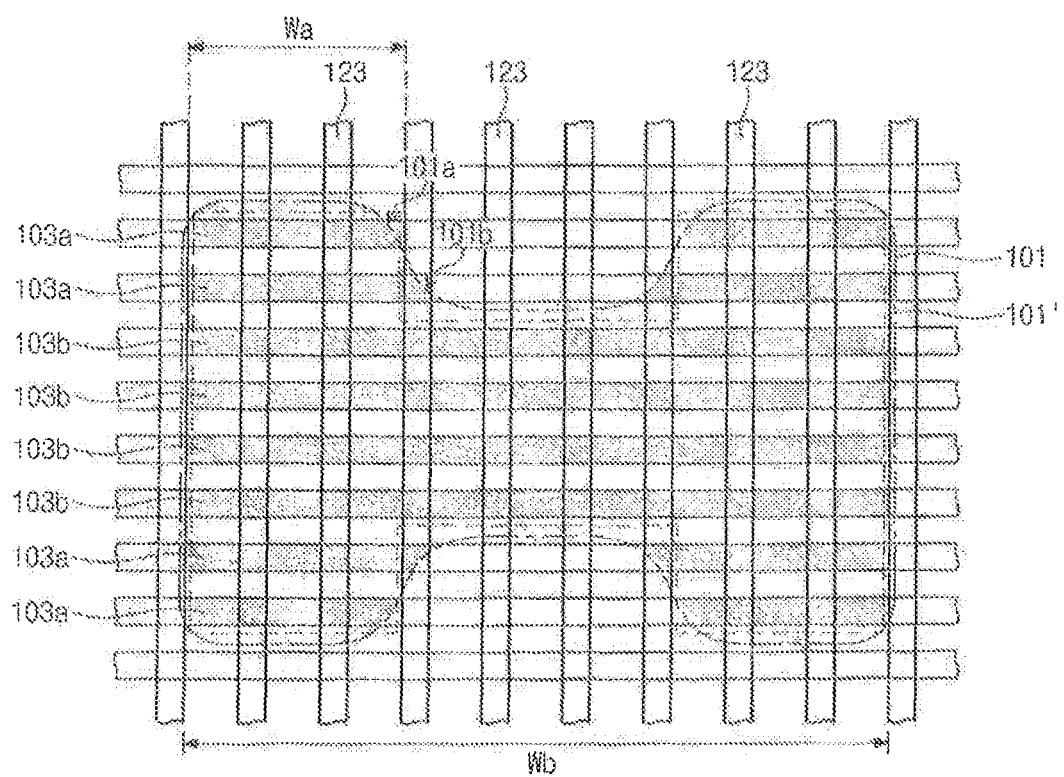

FIGS. 3 to 5 are plan views illustrating portions of test structures of a semiconductor device according to an exemplary embodiment of the inventive concept.

Referring to FIGS. 3, 4 and 5, active regions 101 in test structures have various shapes. For exemplary, the active region 101 of FIG. 3 is substantially U-shaped in a plan view. The active region 101 of FIG. 4 is T-shaped in a plan view. The active region 101 of FIG. 5 is H-shaped in a plan view.

Each of the active regions 101 of FIGS. 3 to 5 includes a first portion having a first width Wa and a second portion having a second width Wb greater than the first width Wa, as described with reference to FIG. 2A. The active region 101 has rounded corner portions 101a and 101b. For example, the active region 101 includes a first corner portion 101a reducing an area of the active region 101 and a second corner portion 101b increasing the area of the active region by the corner rounding effect. The active region 101 has an inflection point between the first corner portion 101a and the second corner portion 101b.

Active patterns 103a and 103b extending in parallel are disposed in the active region 101. The active pattern 103a adjacent to the first corner portion 101a of the active region 101 are reduced compared to the ideal active region 101'. The active patterns 103b adjacent to the second corner portion of the active region are extended compared to the ideal active region 101'. Gate electrodes 123 are disposed on the active region 101 to cross over the active patterns 103a and 103b.

FIGS. 6A to 9A are plan views illustrating a test structure of a semiconductor device according to an exemplary embodiment of the inventive concept. FIGS. 6B to 9B are cross-sectional views taken along lines I-I' and II-II' of FIGS. 6A to 9A to illustrate a test structure of a semiconductor device according to an exemplary embodiment of the inventive concept.

first to fourth test structures 10, 20, 30 and 40 illustrated in FIGS. 6A to 9A and 6B to 9B constitute the test element group TEG of FIG. 1.

Referring to FIGS. 6A to 9A and 6B to 9B, each of the first to fourth test structures 10, 20, 30 and 40 includes a device isolation layer 111 defining an active region 101, active patterns 103a and 103b vertically protruding from the semiconductor substrate 100 of the active region 101 and extending in parallel along one direction, and gate electrodes 123a to 123d crossing over the gate electrodes 103a and 103b, as described with reference to FIGS. 2A to 2C. The active regions 101 of the first to fourth test structures 10, 20, 30 and 40 may be substantially the same as each other. The reference gate electrode 123a crosses over a center portion of the active region 101 and the gate electrodes 123b, 123c and 123d cross over the corner portions 101a and 101b of the active region 101. The active region 101 includes a first active region 101a having a first corner portion 101a and second active region 101b having a second corner portion 101b. Active regions 101 are defined in the semiconductor substrate 100 of each of the test structures 10, 20, 30 and 40, and the active regions 101 may be arranged in a mirror-symmetric manner.

The first to fourth test structures 10, 20, 30 and 40 may evaluate electrical shorts between the active patterns 103a and 103b and the gate electrodes 123a to 123d in the corner portions 101a and 101b of the active region 101. Each of the first to fourth test structures 10, 20, 30 and 40 includes a first electrode pattern 131a, 131b, 131c or 131d connected to the active patterns 103a and 103b at a side of a predetermined gate electrode 123a, 123b, 123c or 123d. Positions of the first electrodes 131a, 131b, 131c and 131d in the first to fourth test structures 10, 20, 30 and 40 may be different from each other. Lengths of the first electrode patterns 131a to 131d in an extending direction of the gate electrodes 123a to 123d may be substantially equal to each other in the first to fourth test structures 10, 20, 30 and 40. Since the active region 101 has the first and second corner portions 101a and 101b and relative positions of the first electrode patterns 131a to 131d are different from each other, overlapping areas of the first electrode patterns 131a to 131d and the active patterns 103a and 103b of the first to fourth test structures 10, 20, 30 and 40 may be different from each other.

Thus, if predetermined voltages are applied to the each first electrode pattern 131a, 131b, 131c or 131d and the gate electrode 123a, 123b, 123c or 123d adjacent thereto in order to evaluate the electrical shorts between the active patterns 103a and 103b and the gate electrodes 123a to 123d, electrical characteristics of the first to fourth test structures 10, 20, 30 and 40 may be different from each other. For example, the predetermined voltages are applied to the first electrode pattern 131a, 131b, 131c or 131d and the gate electrode 123a, 123b, 123c or 123d adjacent thereto, thereby measuring a current flowing through the active patterns 103a and 103b between the first electrode pattern 131a, 131b, 131c or 131d and the gate electrode 123a, 123b, 123c or 123d adjacent thereto. The current flowing through the active patterns 103a and 103b may be measured to evaluate the electrical short between the active patterns 103a and 103b and the gate electrodes 123a to 123d. This will be described in more detail hereinafter. Such electrical short may occur due to breakdown in gate oxide (not shown here) interposed between the gate electrodes and the active patterns.

Figure 6A:
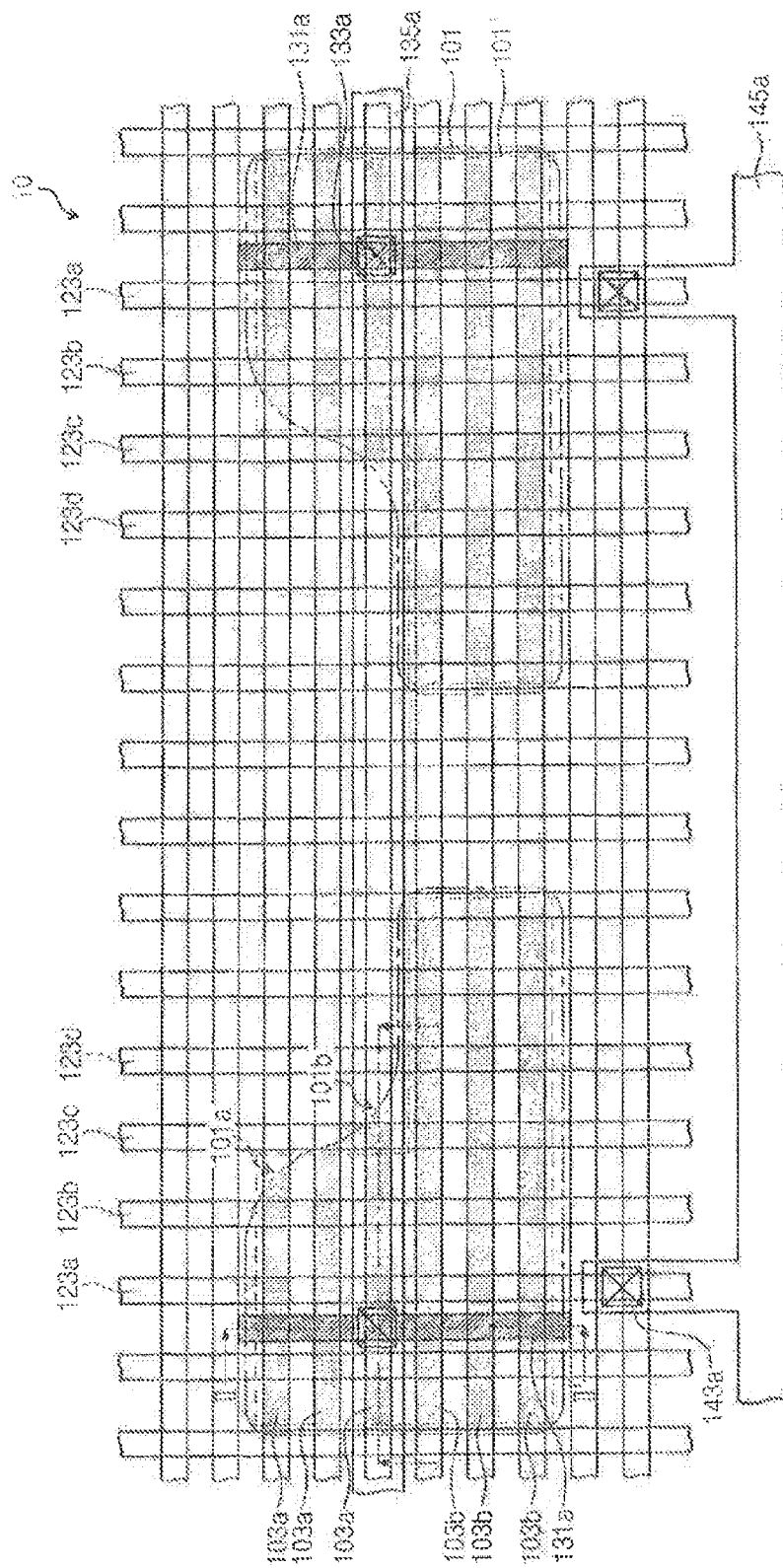
Figure 6B:
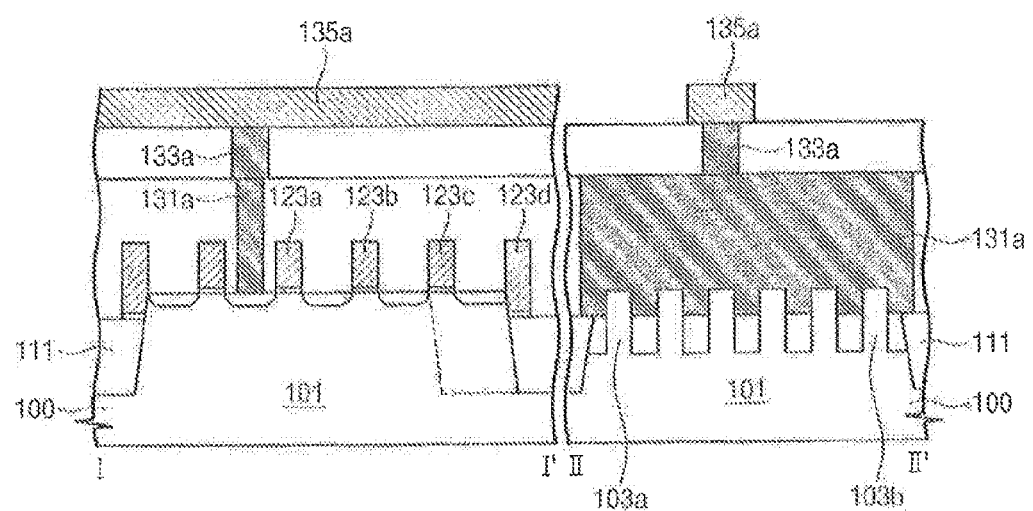

Referring to FIGS. 6A and 6B, the first test structure 10 includes the first electrode pattern 131a disposed at a side of the reference gate electrode 123a. The first electrode pattern 131a is connected to the first active patterns 103a and the second active patterns 103b. The first electrode pattern 131a is electrically connected to a first conductive line 135a through a first contact plug 133a, and the first conductive line 135a is electrically connected to the first test pad PAD1 of FIG. 1. The reference gate electrode 123a is electrically connected to a second conductive line 145a through a second contact plug 143a, and the second conductive line 145a is electrically connected to a reference gate pad (not shown).

The first test structure 10 includes reference gate electrodes 123a and first electrode patterns 131a. The first electrode patterns 131a are connected to the first test pad PAD1 of FIG. 1, and the reference gate electrodes 123a are connected to the reference gate pad (not shown).

In operation, predetermined voltages are applied to the first electrode pattern 131a and the reference gate electrode 123a to evaluate the electrical short between the reference gate electrode 123a and the active patterns 103a and 103b. For exemplary, a positive voltage is applied to the first electrode pattern 131a and a ground voltage is applied to the reference gate electrode 123a. A current flow through the active patterns 103a and 103b between the first electrode pattern 131a and the reference gate electrode 123a under this condition is measured. The magnitude of the current flow is used as a reference value to evaluate the semiconductor device.

Figure 7A:
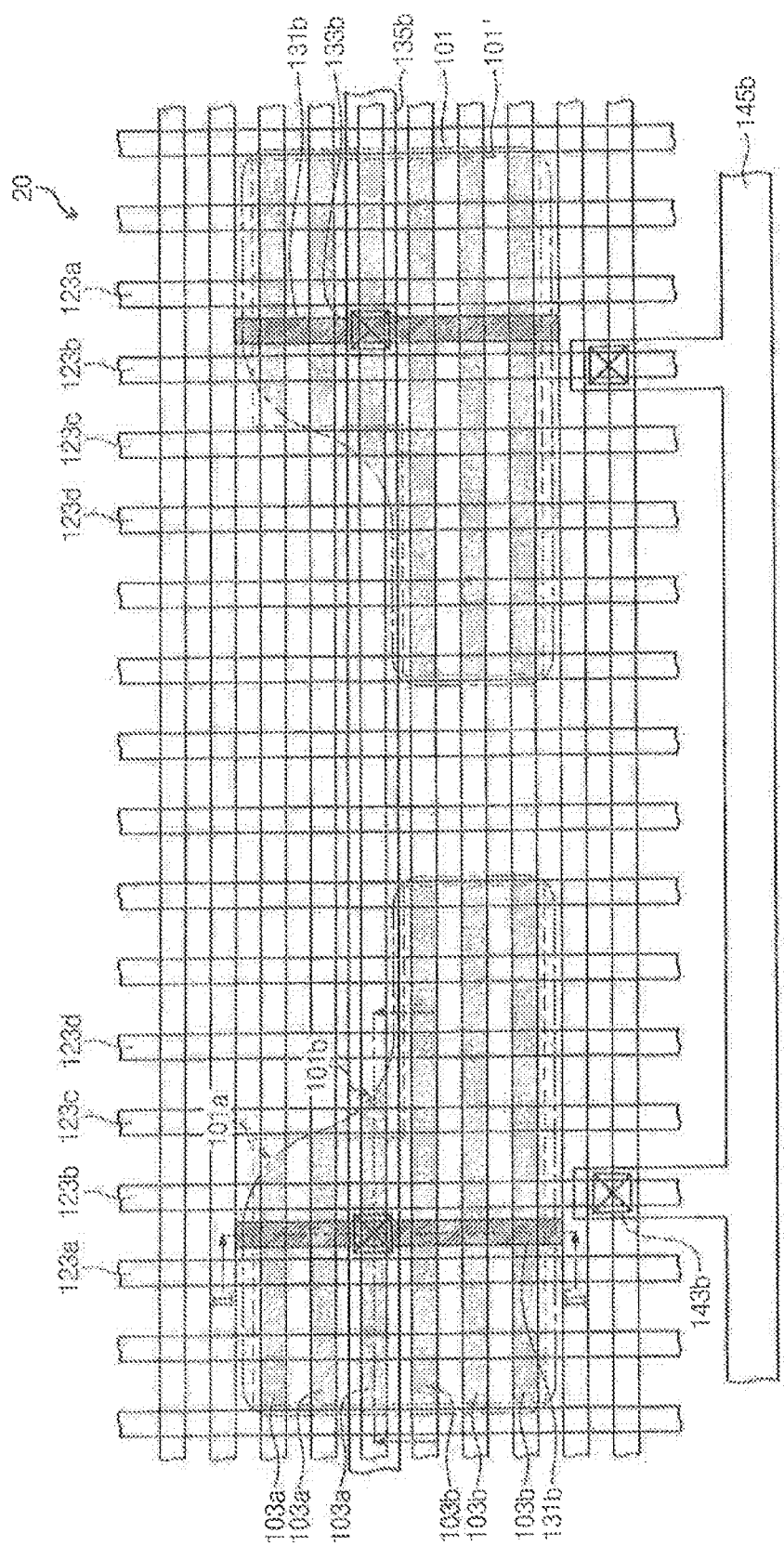
Figure 7B:
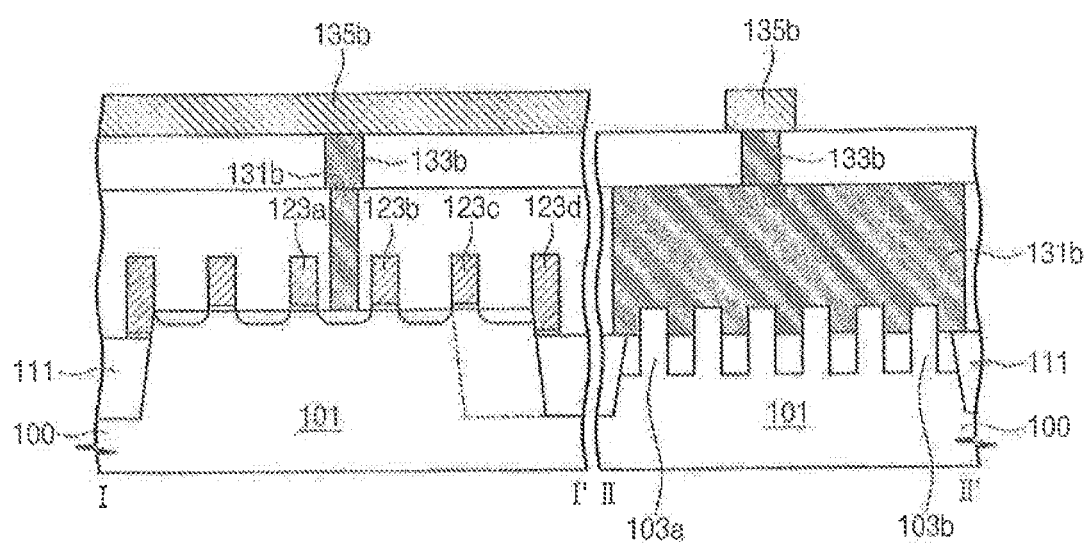

Referring to FIGS. 7A and 7B, the second test structure 20 includes the first electrode pattern 131b disposed at a side of the first gate electrode 123b. The first electrode pattern 131b is connected to the first and second active patterns 103a and 103b. In the second test structure 20, the first electrode pattern 131b is electrically connected to a first conductive line 135b through a first contact plug 133b and the first conductive line 135b is electrically connected to the first test pad PAD1 of FIG. 1. In the second test structure 20, the first gate electrode 123b is electrically connected to a second conductive line 145*b* through a second contact plug 143*b*. The second conductive line 145*b* is electrically connected to a first gate pad (not shown). In the second test structure 20, the first electrode pattern 131*b* may be provided in plural and the first electrode patterns 131*b* may be arranged to be mirror-symmetric. The overlapping area of the first electrode pattern 131*b* and the active patterns 103*a* and 103*b* is reduced according to the radius of curvature of the first corner portion 101*a* as compared with that of the first test structure 10 of FIG. 6A.

Predetermined voltages may be applied to the first electrode pattern 131*b* and the first electrode 123*b*. A current flowing through the active patterns 103*a* and 103*b* between the first electrode pattern 131*b* and the first gate electrode 123*b* is measured to evaluate the electrical short between the first electrode pattern 131*b* and the first gate electrode 123*b*.

Figure 8A:
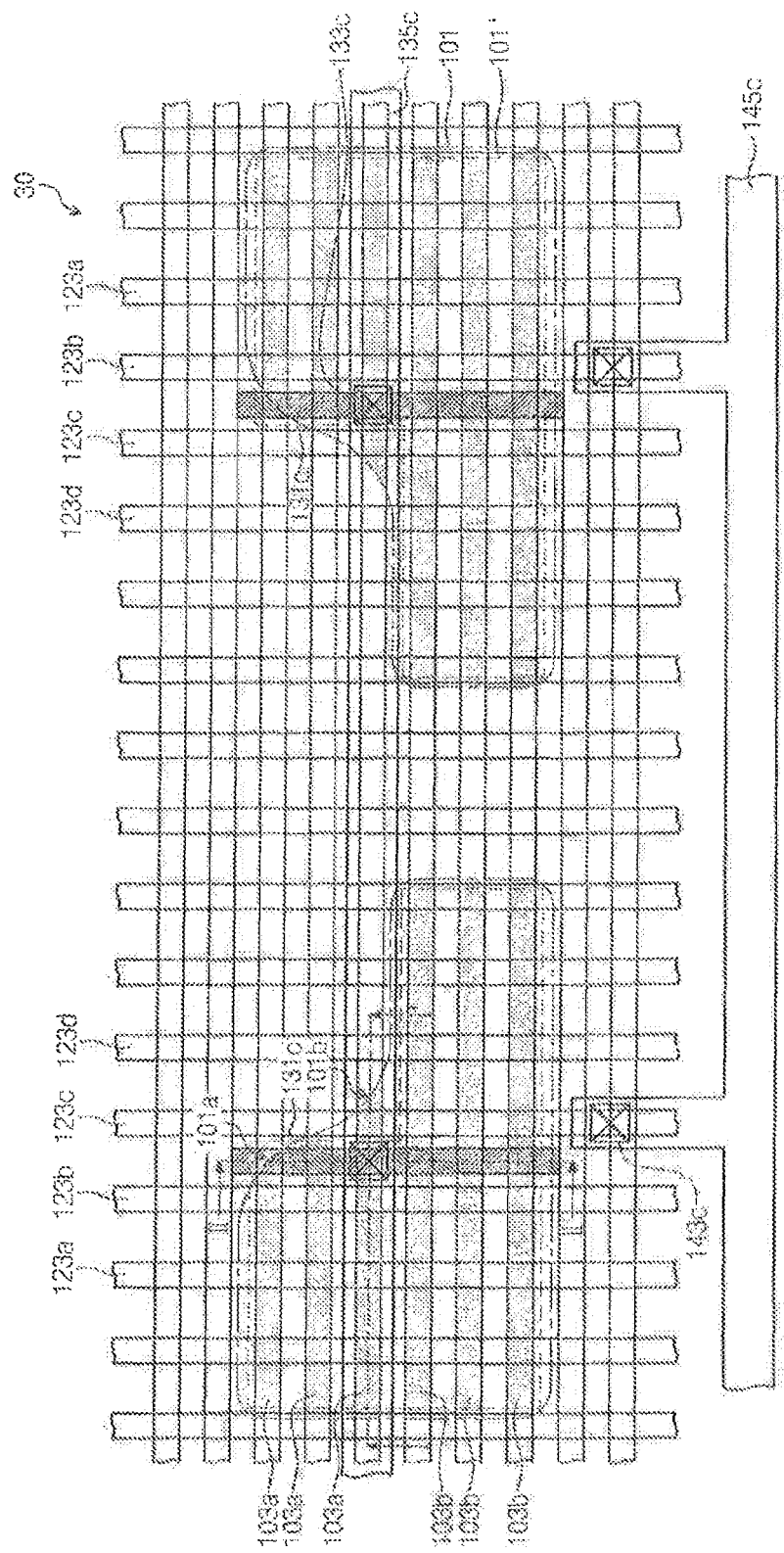
Figure 8B:
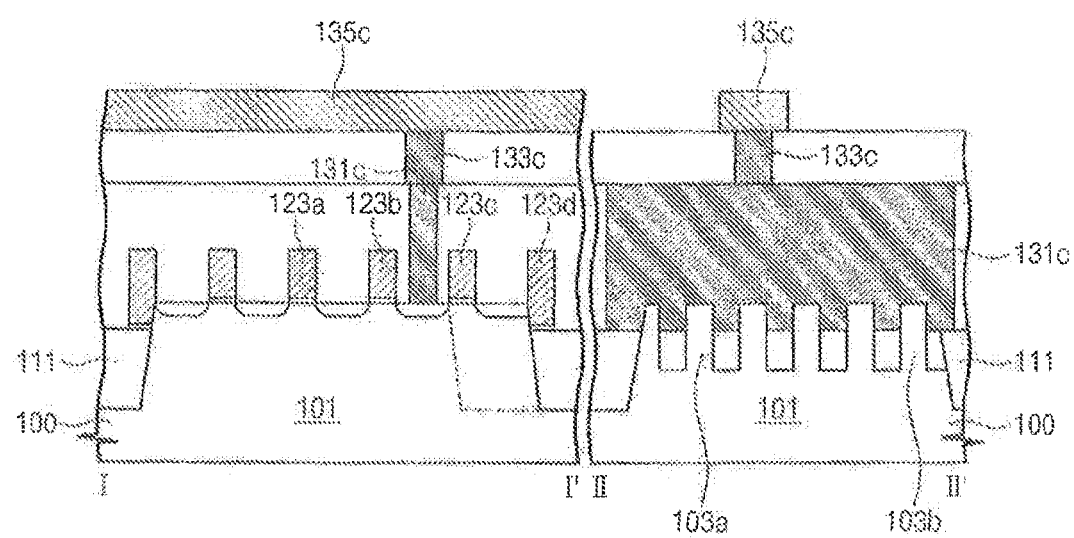

Referring to FIGS. 8A and 8B, the third test structure 30 includes the first electrode pattern 131*c* disposed at a side of the second gate electrode 123*c*. The first electrode pattern 131*c* is connected to the first and second active patterns 103*a* and 103*b*. The first electrode pattern 131*c* is electrically connected to a first conductive line 135*c* through a first contact plug 133*c*. The first conductive line 135*c* is electrically connected to the first test pad PAD1 of FIG. 1. The second gate electrode 123*c* is electrically connected to a second conductive line 145*c* through a second contact plug 143*c*. The second conductive line 145*c* is electrically connected to a second gate pad (not shown).

The first electrode pattern 131*c* of the third test structure 30 is disposed on the first corner portion 101*a* of the active region 101. The overlapping area of the first electrode pattern 131*c* and the active patterns 103*a* and 103*b* is reduced as compared with those of the first and second test structures 10 and 20 of FIGS. 6A and 7A.

Like the first and second test structures 10 and 20 of FIGS. 6A and 7A, predetermined voltages are applied to the first electrode pattern 131*c* and the second gate electrode 123*c* to evaluate the electrical short between the second gate electrode 123*c* and the active patterns 103*a* and 103*b*. For exemplary, a positive voltage is applied to the first electrode pattern 131*c* and a ground voltage is applied to the second gate electrode 123*c*.

Figure 9B:
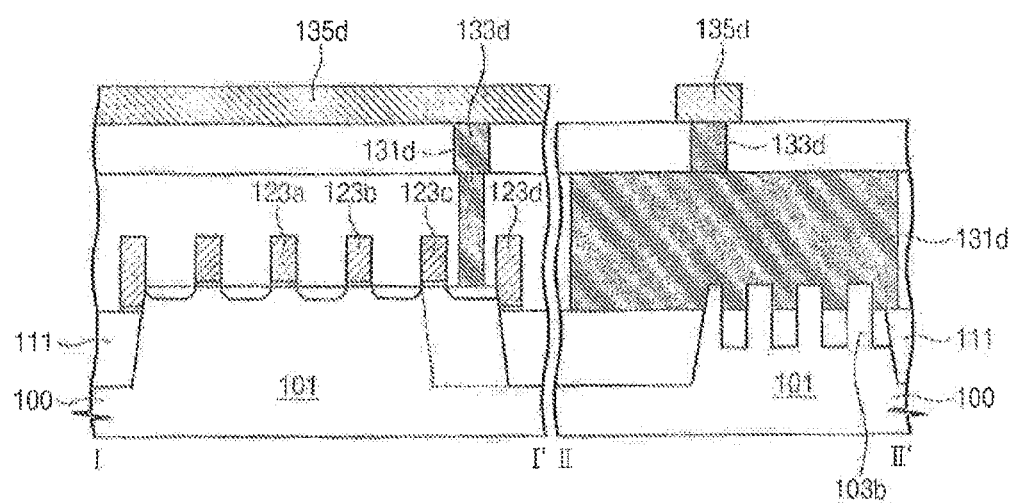

Referring to FIGS. 9A and 9B, the fourth test structure 40 includes the first electrode pattern 131*d* disposed at a side of the third gate electrode 123*d*. The first electrode pattern 131*d* is connected to the first and second active patterns 103*a* and 103*b*. In the fourth test structure 40, the length of the first electrode pattern 131*d* is substantially equal to the lengths of the first electrode patterns 131*a* to 131*c* of the first to third test structures 10, 20 and 30 of FIGS. 6A, 7A and 8A. The first electrode pattern 131*d* of the fourth test structure 40 crosses over the second portion of the active region 101 and is disposed on the second corner portion 101*b* of the active region 101. Thus, an overlapping area of the first electrode pattern 131*d* and the active patterns 103*a* and 103*b* of the fourth test structure 40 is reduced as compared with that of the third test structure 30 of FIG. 8A.

In the fourth test structure 40, the first electrode pattern 131*d* is electrically connected to a first conductive line 135*d* through a first contact plug 133*d* and the first conductive line 135*d* is electrically connected to the first test pad PAD1 of FIG. 1. In the fourth test structure 40, the third gate electrode 123*d* is electrically connected to the second conductive line 145*d* through the second contact plug 143*d* and the second conductive line 145*d* is electrically connected to a third gate pad (not shown).

Predetermined voltages may be applied to the first electrode pattern 131*d* and the third gate electrode 123*d* in order to evaluate the electrical short between the third gate electrode 123*d* and the active patterns 103*a* and 103*b*. For example, a positive voltage may be applied to the first electrode pattern 131*d* and a ground voltage may be applied to the third gate electrode 123*d*.

The first active pattern 103*a* crosses over the third gate electrode 123*d* at the second corner portion 101*b* of the active region 101. Thus, the first active pattern 103*a* may be in contact with the third gate electrode 123*d*. Accordingly, if predetermined voltages are applied to the first electrode pattern 131*d* and the third gate electrode 123*d*, an electrical short may occur between the first active pattern 103*a* and the third gate electrode 123*d*. When the fourth test structure 40 is tested, the electrical short between the first electrode pattern 131*d* and the third gate electrode 123*d* may be detected unlike the first to third test structures 10, 20 and 30.

FIGS. 10A to 12A are plan views illustrating a test structure of a semiconductor device according to an exemplary embodiment of the inventive concept. FIGS. 10B to 12B are cross-sectional views taken along lines I-I' and II-II' of FIGS. 10A to 12A to illustrate a test structure of a semiconductor device according to an exemplary embodiment of the inventive concepts.

The first to third test structures 10, 20 and 30 of FIGS. 10A to 12A and 10B to 12B constitutes the test element group TEG described with reference to FIG. 1.

Referring to FIGS. 10A to 12A and 10B to 12B, each of the first to third test structures 10, 20 and 30 includes a device isolation layer 111 defining an active region 101, active patterns 103*a* and 103*b* vertically protruding from the semiconductor substrate 100 and extending in parallel along one direction, and gate electrodes 123*a* to 123*d* crossing over the gate electrodes 103*a* and 103*b*, as described with reference to FIGS. 2A to 2C. The gate electrodes 123*a* to 123*d* may include a reference gate electrode 123*a* crossing over a center portion of the active region 101 and first to third gate electrodes 123*b*, 123*c* and 123*d* adjacent to corner portions 101*a* and 101*b* of the active region 101. The active region 101 includes a first corner portion 101*a* reducing an area of the active region 101 and a second corner portion 101*b* increasing the area of the active region by the corner rounding phenomenon. Active regions 101 are formed in each of the test structures 10, 20, 30 and 40, and the active regions 101 are arranged to be mirror-symmetric.

Each of the first to third test structures 10, 20 and 30 includes a first electrode pattern 131*a*, 131*b* or 131*c* disposed at a side of a predetermined gate electrode 123*a*, 123*b*, 123*c* or 123*d* and a second electrode pattern 151*a*, 151*b* or 151*c* disposed at another side of the predetermined gate electrode 123*a*, 123*b*, 123*c* or 123*d* to evaluate losses of the active patterns 103*a* and 103*b* on the corner portions 101*a* and 101*b* of the active region 101. The first and second electrode patterns 131*a* to 131*c* and 151*a* to 151*c* may be disposed at different positions from each other in the first to third test structures 10, 20 and 30.

Predetermined voltages may be applied to the first electrode pattern 131*a*, 131*b* or 131*d* and the second electrode pattern 151*a*, 151*b* or 151*c* and a turn-on voltage may be applied to the predetermined gate electrode 123*a*, 123*b*, 123*c* or 123*d* disposed between the first electrode pattern 131*a*, 131*b* or 131*d* and the second electrode pattern 151*a*, 151*b* or 151*c*, thereby measuring a current flowing through the active patterns 103*a* and 103*b* between the first electrode pattern 131*a*, 131*b* or 131*d* and the second electrode pattern 151*a*, 151*b* or 151*c*. Thus, the losses of the active patterns 103*a* and 103*b* of the first to third test structures 10, 20 and 30 may be evaluated.

The lengths of the first and second electrode patterns 131a to 131c and 151a to 151c in an extending direction of the gate electrodes 123a to 123d are substantially equal to each other in the first to third test structures 10, 20 and 30. Since the active regions 101 have the first and second corner portions 101a and 101b, overlapping areas of the first electrode patterns 131a to 131c and the active patterns 103a and 103b may be varied depending on positions of the first electrode patterns 131a to 131c in the first to third test structures 10, 20 and 30. Additionally, overlapping areas of the second electrode patterns 151a to 151c and the active patterns 103a and 103b may be varied depending on positions of the second electrode patterns 151a to 151c. Thus, the amounts of the currents through the active patterns 103a and 103b between the first electrode patterns 131a to 131c and the second electrode patterns 151a to 151c may be varied in the first to third test structures 10, 20 and 30. The first to third test structures 10, 20 and 30 may evaluate the losses of the active patterns 103a and 103b using the current variation. Additionally, fin field effect transistors tested on a plurality of active regions 101 may be connected in parallel to each other. The test structures 10, 20, 30 and 40 will be described in more detail hereinafter.

Figure 10B:
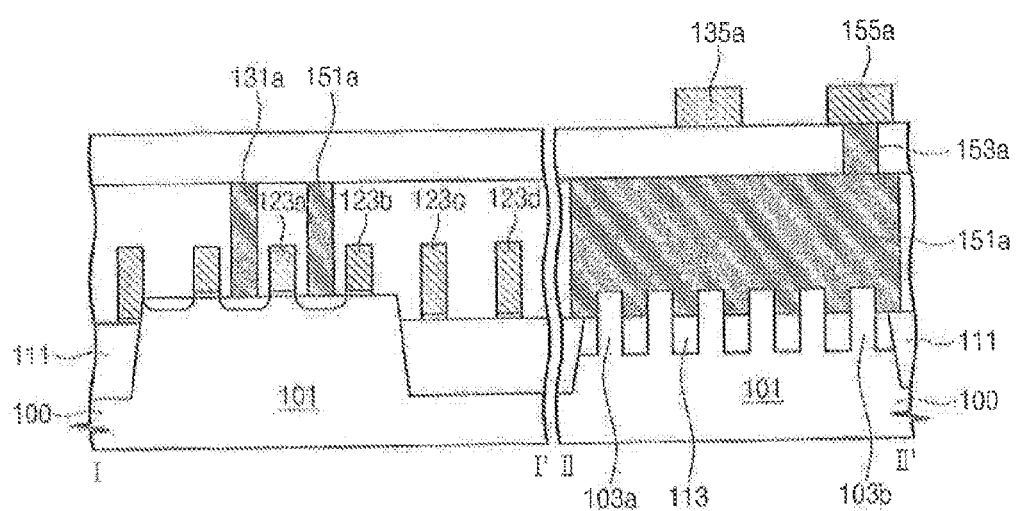

Referring to FIGS. 10A and 10B, the first test structure 10 includes the first electrode pattern 131a disposed at a side of the reference gate electrode 123a and the second electrode pattern 151a disposed at another side of the reference gate electrode 123a. The first and second electrode patterns 131a and 151 extend in parallel to the reference gate electrode 123a. The first electrode pattern 131a and the second electrode pattern 151a are connected to the first and second active patterns 103a and 103b, respectively.

The first electrode pattern 131a is electrically connected to a first conductive line 135a through a first contact plug 133a, and the first conductive line 135a may be electrically connected to the first test pad PAD1 of FIG. 1. The reference gate electrode 123a is electrically connected to a second conductive line 145a through a second contact plug 143a, and the second conductive line 145a may be electrically connected to a reference gate pad (not shown). The second electrode pattern 151a is electrically connected to a third conductive line 155a through a third contact plug 153a, and the third conductive line 155a is electrically connected to the second test pad PAD2 of FIG. 1.

A turn-on current of a fin field effect transistor flows through the active patterns 103a and 103b between the first and second electrode patterns 131a and 151a when a turn-on voltage is applied to the reference gate electrode 123a of the first test structure.

Figure 11A:
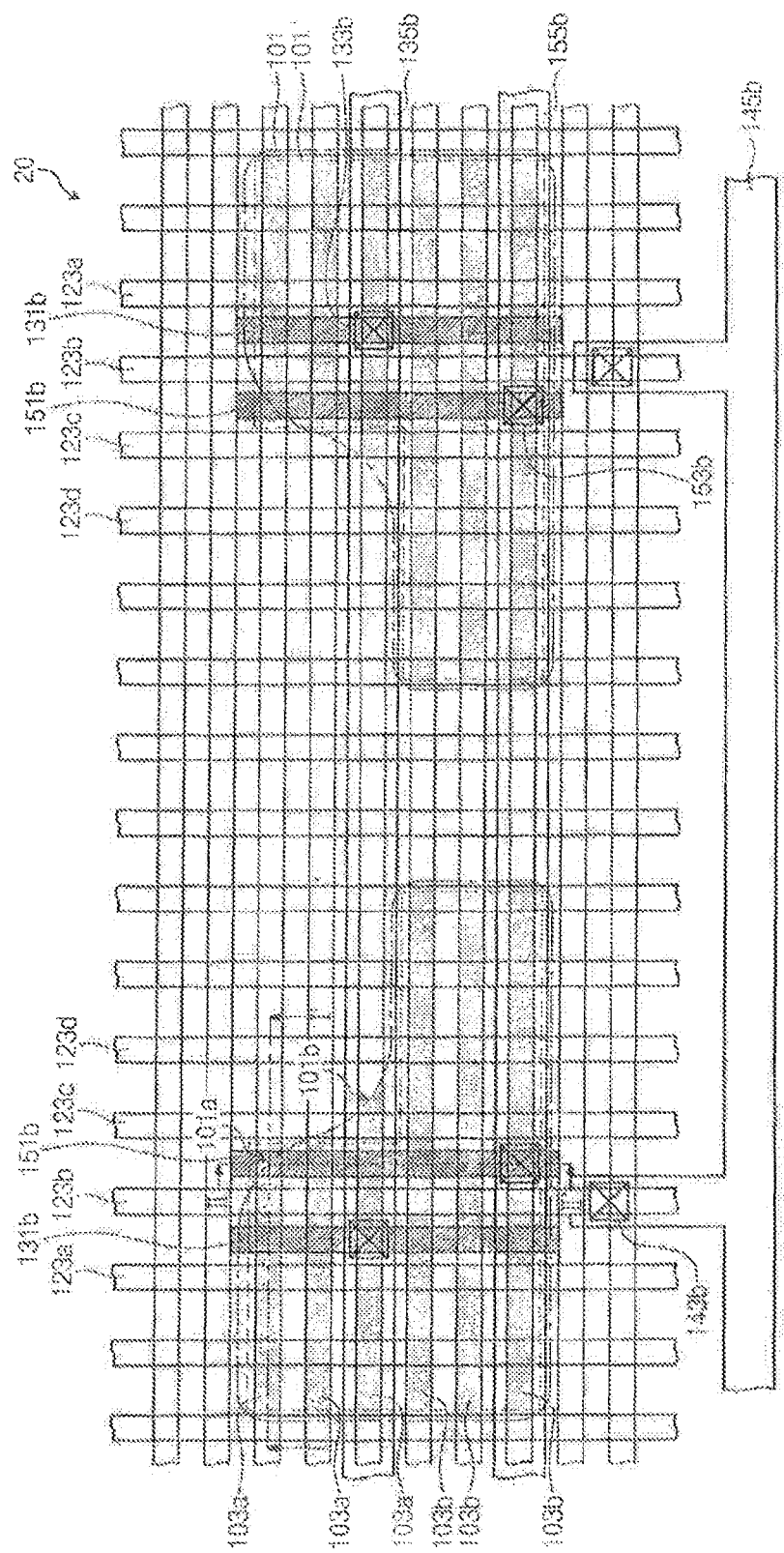
Figure 11B:
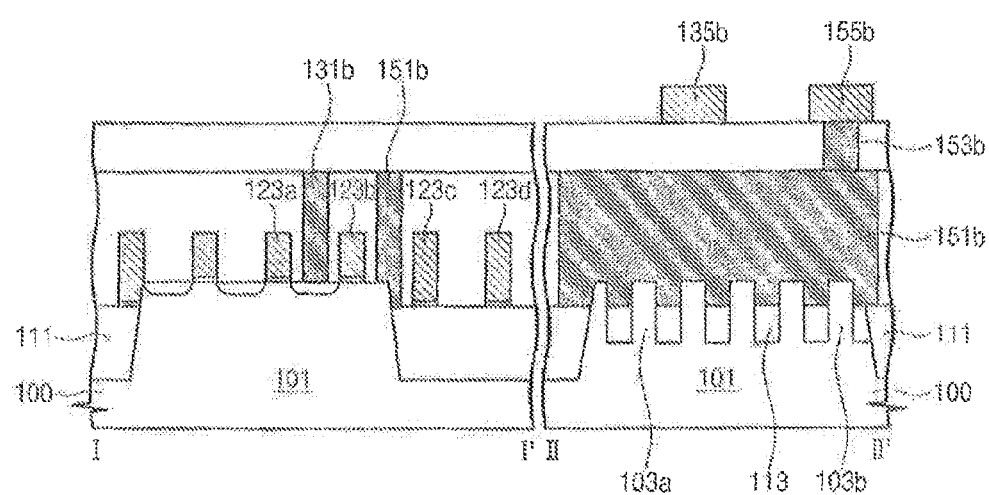

Referring to FIGS. 11A and 11B, the second test structure 20 includes the first electrode pattern 131b disposed at a side of the first gate electrode 123b and the second electrode pattern 151b disposed at another side of the first gate electrode 123b. The first and second electrode patterns 131b and 151b extend in parallel to the first gate electrode 123b and are connected to the active patterns 103a and 103b, respectively. The lengths of the first and second electrode patterns 131b and 151b of the second test structure 20 are substantially equal to the lengths of the first and second electrode patterns 131a and 151a of the first test structure 10 of FIG. 10A. The second electrode pattern 151b is electrically connected to a third conductive line 155b through a third contact plug 153b, and the third conductive line 155b may be electrically connected to the second test pad PAD2 of FIG. 1.

The second electrode pattern 151b is disposed on the first corner portion 101a of the active region 101 in the second test structure 20. Portions of the first active patterns 103a are lost in the first corner portion 101a of the active region 101, so that the overlapping area of the second electrode pattern 151b and the active patterns 103a and 103b is less than the overlapping area of the second electrode pattern 151a and the active patterns 103a and 103b in the first test structure 10 of FIG. 10A. Thus, the current amount of the second test structure 20 may be different from the current amount of the first test structure 10 of FIG. 10A when a turn-on voltage is applied to the first gate electrode 123b to evaluate a current flow between the first and second electrode patterns 131b and 151b.

Figure 12A:
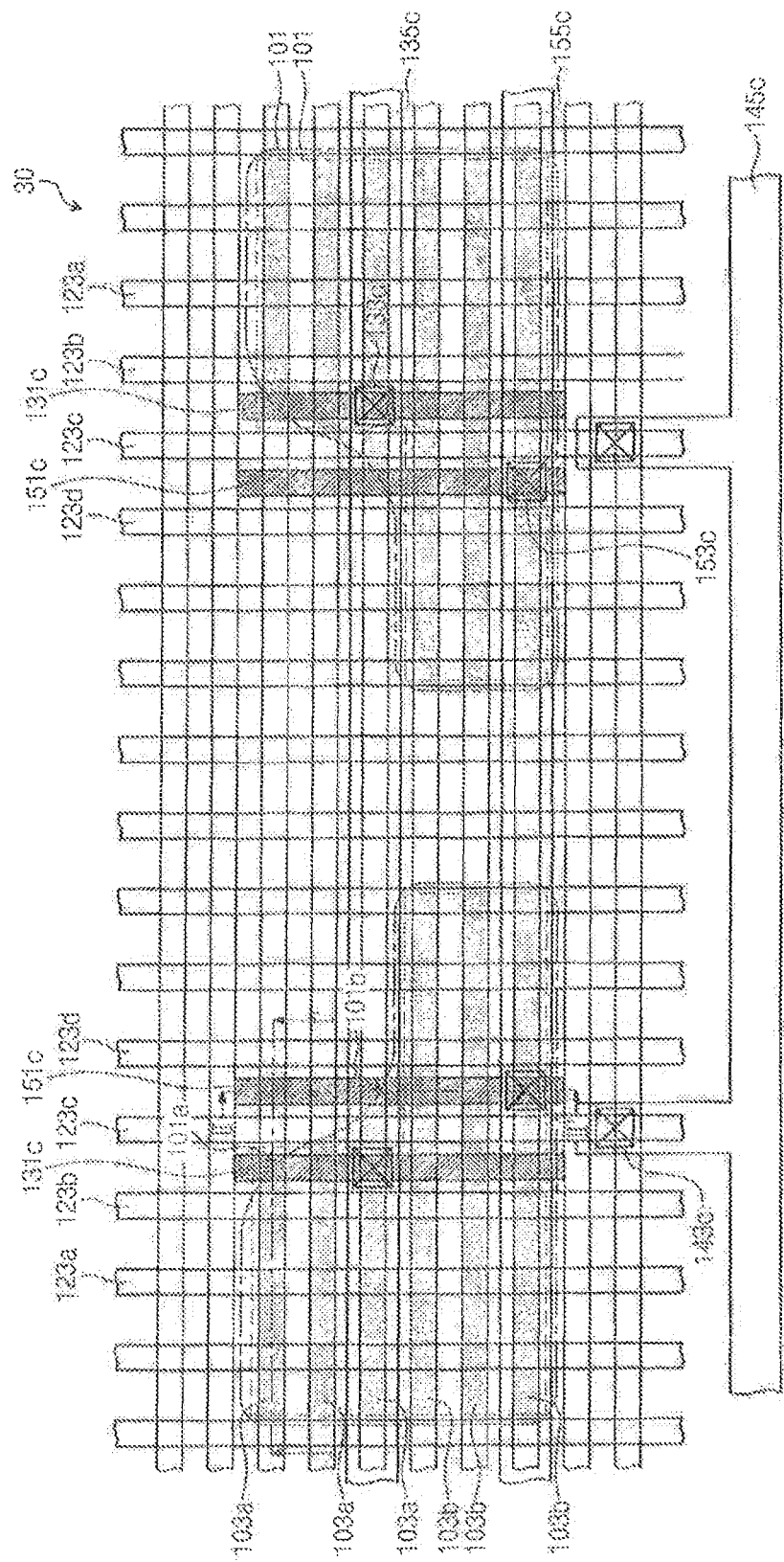
Figure 12B:
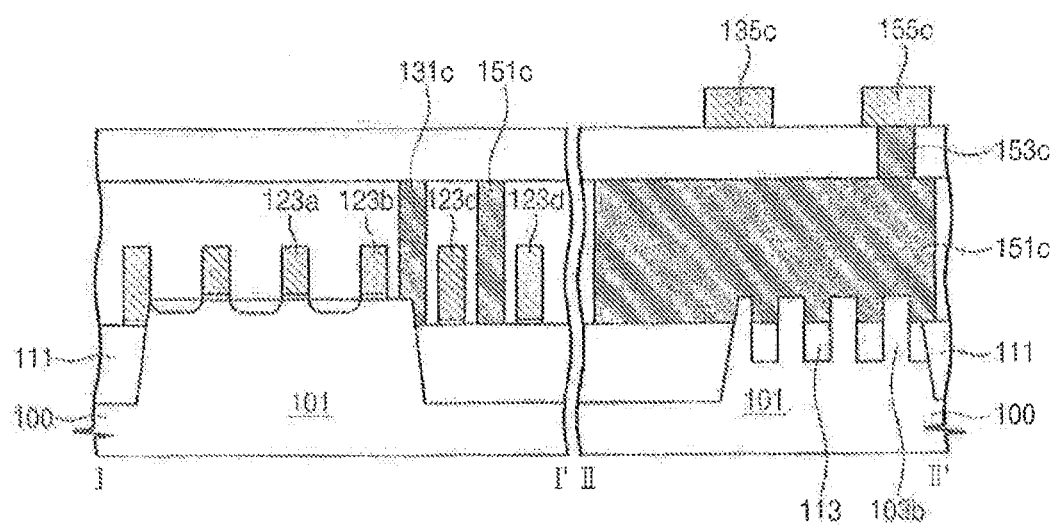

Referring to FIGS. 12A and 12B, the third test structure 30 includes the first electrode pattern 131c disposed at a side of the second gate electrode 123c and the second electrode pattern 151c disposed at another side of the second gate electrode 123c. The first and second electrode patterns 131c and 151c extend in parallel to the second gate electrode 123c and are connected to the active patterns 103a and 103b, respectively. The lengths of the first and second electrode patterns 131c and 151c of the third test structure 30 may be substantially equal to the lengths of the first and second electrode patterns 131a and 151a of the first test structure 10 of FIG. 10A. The second electrode pattern 151c is electrically connected to a third conductive line 155c through a third contact plug 153c, and the third conductive line 155c may be electrically connected to the second test pad PAD2 of FIG. 1.

The first electrode pattern 131c is disposed on the first corner portion 101a of the active region 101, and the second electrode pattern 151c is disposed on the second corner portion 101b of the active region 101. Portions of the first active patterns 103a are lost on the first corner portion 101a of the active region 101 such that the overlapping area of the first electrode pattern 131c and the active patterns 103a and 103b is less than those of the first and second test structures 10 and 20 of FIGS. 10A and 11A. Additionally, the second electrode pattern 151c is disposed to cross the second corner portion 101b of the active region 101 such that the overlapping area of the second electrode pattern 151c and the active patterns 103a and 103b is less than those of the first and second test structures 10 and 20 of FIGS. 10A and 11A. Moreover, the length of the first active patterns 103a increases on the second corner portion 101b of the active region 101, and thus a current flow may occur in the first active pattern 103a of the second corner portion 101b when a turn-on voltage is applied to the second gate electrode 123c.

Even though not shown in the drawings, the first and second electrode patterns may be disposed with the third gate electrode 123d therebetween in a fourth test structure. The third gate electrode 123d may cross the second portion of the active region 101. Thus, a turn-on current may be applied to the third gate electrode 123d and a current flow may be measured between the first and second electrode patterns to evaluate an electrical characteristic of the second active patterns 103b between the first and second electrode patterns.

FIGS. 13A to 17A are plan views illustrating a test structure of a semiconductor device according to an exemplary embodiment of the inventive concept. FIGS. 13B to 17B are cross-sectional views taken along lines I-I' and II-II' of FIGS. 13A to 17A to illustrate a test structure of a semiconductor device according to an exemplary embodiment of the inventive concept.

The test structures 10, 20, 30, 40 and 50 of FIGS. 13A to 17A and 13B to 7B may constitute the test element group TEG described with reference to FIG. 1.

Each of the test structures 10, 20, 30, 40 and 50 includes a device isolation layer 111 defining an active region 101, active patterns 103a and 103b vertically protruding from the semiconductor substrate 100 of the active region 101 and extending in parallel along one direction, and gate electrodes 123a to 123d crossing over the gate electrodes 103a and 103b, as described above. The gate electrodes 123a to 123d may include a reference gate electrode 123a crossing over a center portion of the active region 101 and first to third gate electrodes 123b, 123c and 123d adjacent to corner portions 101a and 101b of the active region 101. The active region 101 includes a first corner portion 101a reducing an area of the active region 101 and a second corner portion 101b increasing the area of the active region by the corner rounding phenomenon. Active regions 101 may be defined in the semiconductor substrate 100 of each of the test structures 10, 20, 30, 40 and 50, and the active regions 101 may be arranged to be mirror-symmetric.

Each of the test structures 10, 20, 30, 40 and 50 includes a first electrode pattern 131a, 131b, 131c, 131d or 131e disposed at a side of a predetermined gate electrode 123a, 123b, 123c or 123d and a second electrode pattern 151a, 151b, 151c, 151d or 151e disposed at another side of the predetermined gate electrode 123a, 123b, 123c or 123d. Here, each of end portions of the first and second electrode patterns 131a to 131e and 151a to 151e may be disposed on a single first active pattern 103a adjacent to the first corner portion 101a or the second corner portion 101b.

The test structures 10 and 20 illustrated in FIGS. 13A, 13B, 14A and 14B may evaluate variability of the active patterns 103a and 103b on the first corner portion 101a of the active region 101. The test structures 30 and 40 illustrated in FIGS. 15A, 15B, 16A and 16B may evaluate variability of the active patterns 103a and 103b on the second corner portion 101b of the active region 101. Fin field effect transistors tested on active regions 101 may be connected in series to each other, and a current flow of the fin field effect transistors connected in series may be tested to evaluate connectivity of the active patterns 103a and 103b. The test structures 10, 20, 30, 40 and 50 will be described in more detail hereinafter.

Figure 13A:
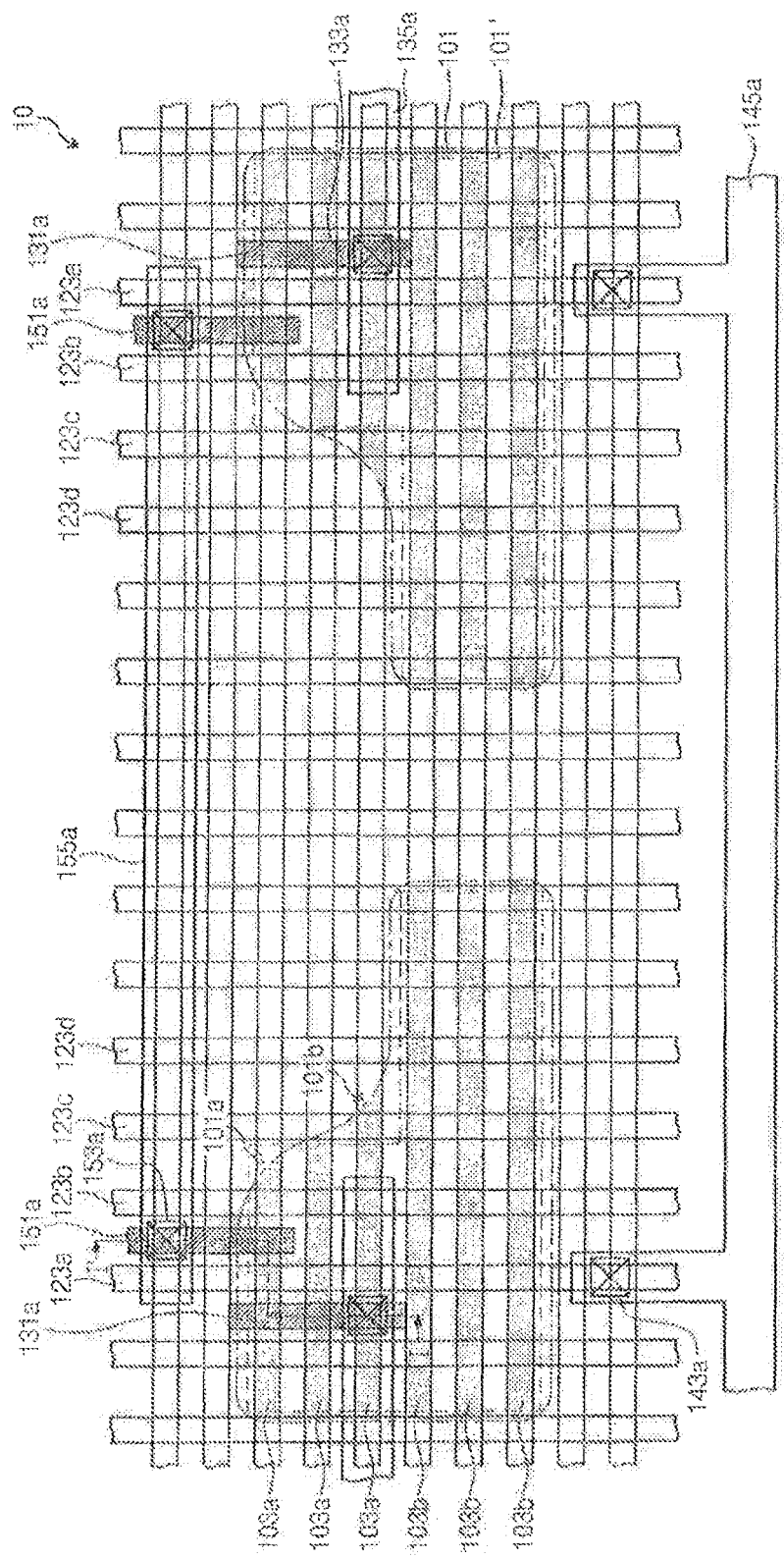
Figure 13B:
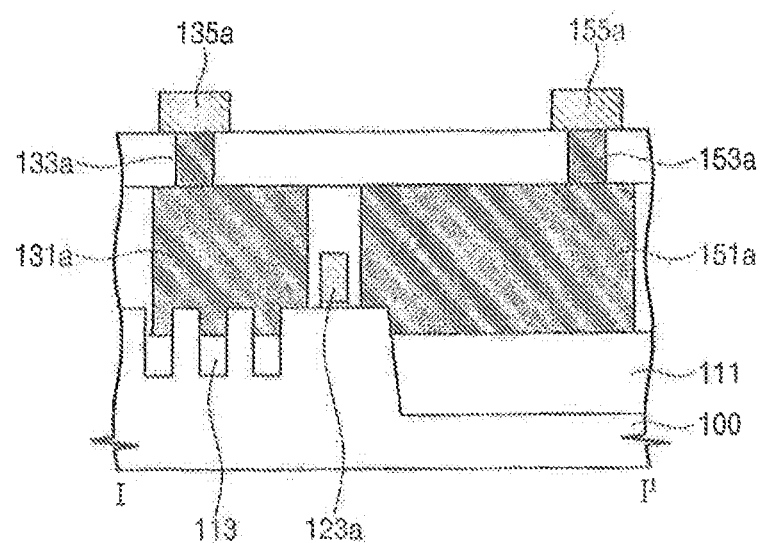

Referring to FIGS. 13A and 13B, the first test structure 10 includes the first electrode pattern 131a disposed at a side of the reference gate electrode 123a and the second electrode pattern 151a disposed at another side of the reference gate electrode 123a. The end portions of the first and second electrode patterns 131a and 151a are disposed on a single first active pattern 103a adjacent to the first corner portion 101a. For example, the first electrode pattern 131a is disposed in the active region 101 when viewed from a plan view, and the second electrode pattern 151a overlaps with the first active pattern 103a adjacent to the first corner portion 101a. The first electrode pattern 131a is electrically connected to a first conductive line 135a through a first contact plug 133a, and the first conductive line 135a may be electrically connected to the first test pad PAD1 of FIG. 1. The reference gate electrode 123a is electrically connected to a second conductive line 145a through a second contact plug 143a, and the second conductive line 145a may be electrically connected to a reference gate pad (not shown). The second electrode pattern 151a is electrically connected to a third conductive line 155a through a third contact plug 153a, and the third conductive line 155a is electrically connected to the second test pad PAD2 of FIG. 1.

When a turn-on voltage is applied to the reference gate electrode 123a, the first electrode pattern 131a and the second electrode pattern 151a are connected in series to each other. At this time, a current flow through the first active pattern 103a between the first and second electrode patterns 131a and 151a may be measured.

Figure 14A:
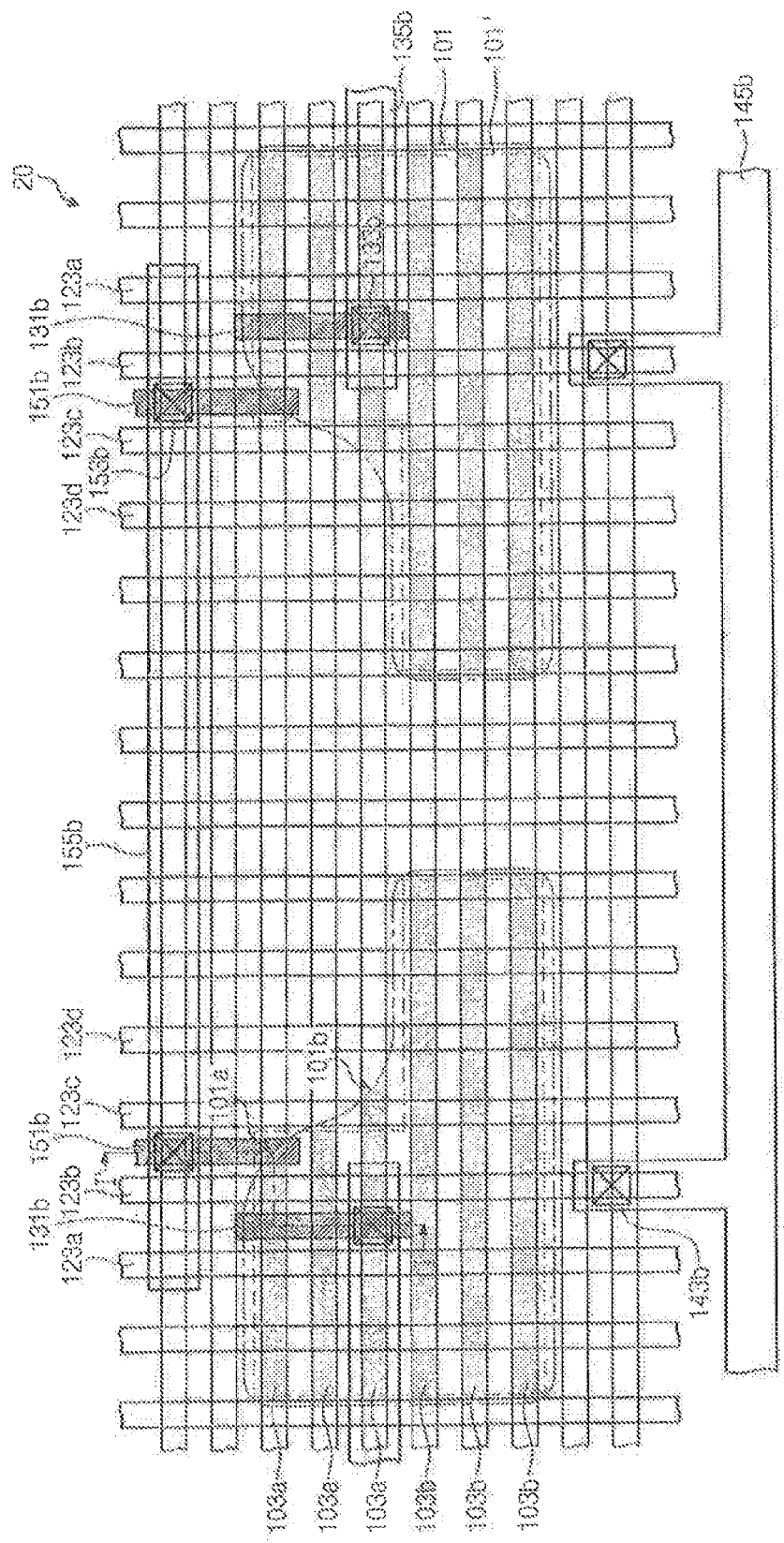
Figure 14B:
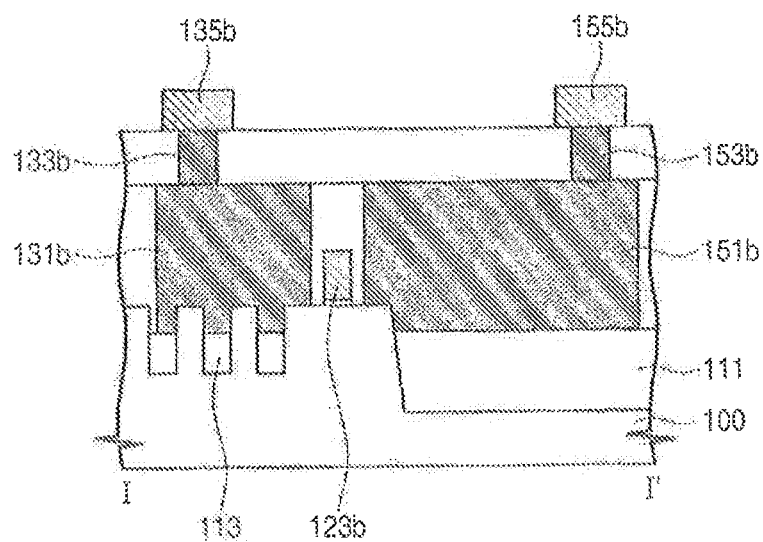

Referring to FIGS. 14A and 14B, the second test structure 20 includes the first electrode pattern 131b disposed at a side of the first gate electrode 123b and the second electrode pattern 151b disposed at another side of the first gate electrode 123b. The end portions of the first and second electrode patterns 131b and 151b may be disposed on the single first active pattern 103a adjacent to the first corner portion 101a in the second test structure 20. Here, the first electrode pattern 131b is disposed in the active region 101 when viewed from a plan view, and the second electrode pattern 151b is disposed on the device isolation layer 111 and a boundary between the device isolation layer 111 and the first corner portion 101a. The length of the second electrode pattern 151b of the second test structure 20 may be substantially equal to the length of the second electrode pattern 151a of the first test structure 10. The overlapping area of the second electrode pattern 151b and the first active pattern 103a adjacent to the first corner portion 101a is less than the overlapping area of the second electrode pattern 151a and the first active pattern 103a adjacent to the first corner portion 101a in the first test structure 10 of FIG. 13A.

When a turn-on voltage is applied to the first gate electrode 123b, the first electrode pattern 131b and the second electrode pattern 151b are connected in series to each other. At this time, a current flow through the first active pattern 103a between the first and second electrode patterns 131b and 151b may be measured. The amount of the current measured from the second test structure 20 may be compared with the amount of the current measured from the first test structure 10 of FIG. 13A such that a loss of the first active pattern 103a may be evaluated. Additionally, the radius of curvature in the first corner portion 101a may be calculated according to a loss amount of the first active pattern 103a.

Figure 15A:
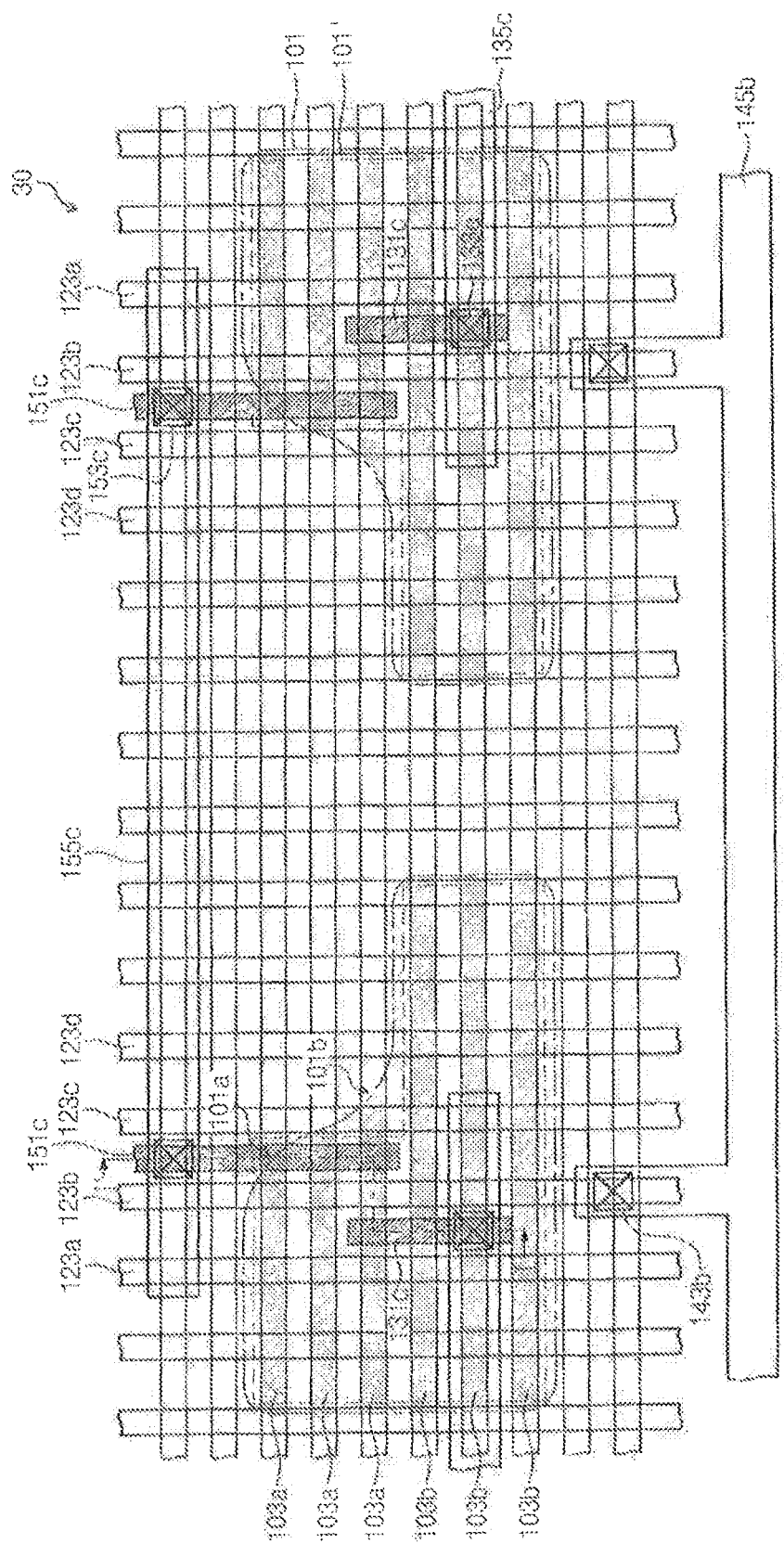
Figure 15B:
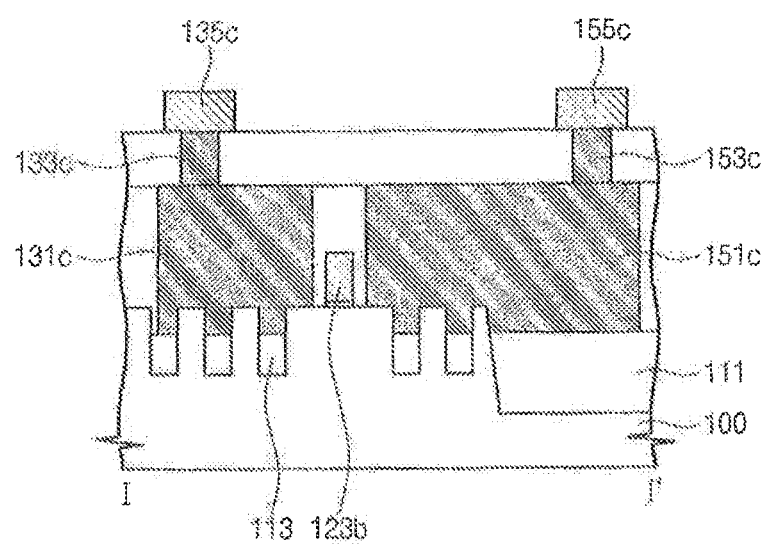

Referring to FIGS. 15A and 15B, the third test structure 30 includes the first electrode pattern 131c disposed at a side of the first gate electrode 123b and the second electrode pattern 151b disposed at another side of the first gate electrode 123b. The end portions of the first and second electrode patterns 131c and 151c are disposed on a single first active patterns 103a crossing over the second corner portion 101b. For example, the first electrode pattern 131c is disposed in the active region 101 when viewed from a plan view, and the second electrode pattern 151c overlaps with the first active patterns 103a adjacent to the second corner portion 101a.

A turn-on voltage may be applied to the first gate electrode 123b and a current flow between the first and second electrode patterns 131c and 151c may be measured. The current flow through the first active pattern 103a extending to the second corner portion 101b.

Figure 16A:
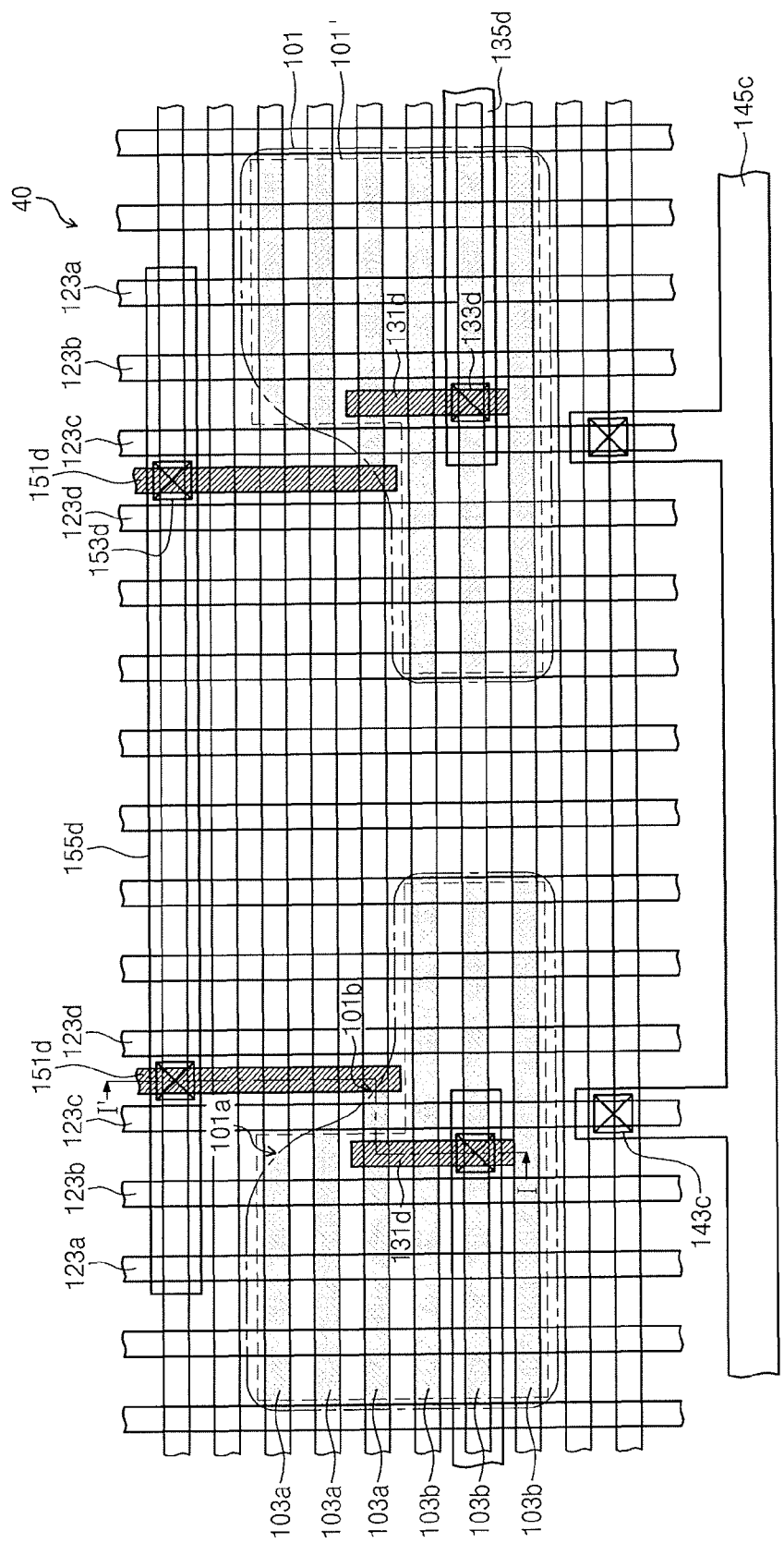
Figure 16B:
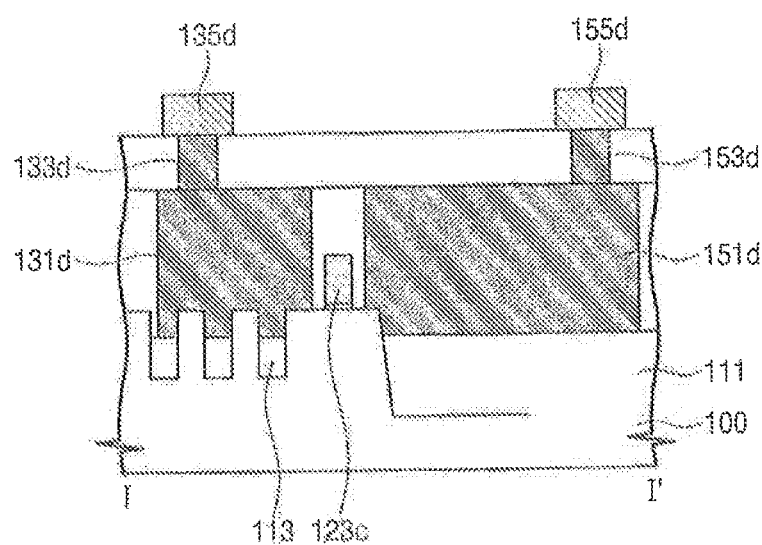

Referring to FIGS. 16A and 16B, the fourth test structure 40 includes the first electrode pattern 131d disposed at a side of the second gate electrode 123c and the second electrode pattern 151d disposed at another side of the second gate electrode 123c. Here, the length of the second electrode pattern 151d of the fourth test structure 40 may be substantially equal to the length of the second electrode pattern 151c of the third test structure 30. End portions of the first and second electrode patterns 131d and 151d are disposed on the first active pattern 103a extending to the second corner portion 101b. An electrical connection state between the second electrode pattern 151d and the first active pattern 103a may be varied depending on the radius of curvature of the second corner portion 101b. For example, the overlapping area between the second electrode pattern 151d and the active patterns 103a may be varied depending on the radius of curvature of the second corner portion 101b. For example, the overlapping area between the second electrode pattern 151d and the active patterns 103a of the fourth test structure 40 is less than the overlapping area between the second electrode pattern 151c and the active patterns 103a of the third test structure 30 of FIG. 15A. Thus, modification of the active pattern 103*a* in the second corner portion 101*b* may be evaluated, and the radius of curvature of the second corner portion 101*b* may be evaluated using the evaluated modification of the active pattern 103*a*.

Figure 17B:
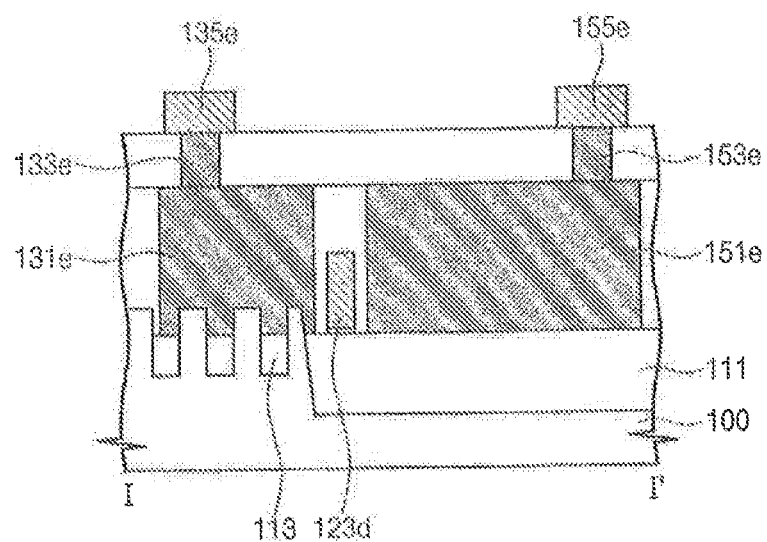

Referring to FIGS. 17A and 17B, the fifth test structure 50 includes the first electrode pattern 131*e* disposed at a side of the third gate electrode 123*d* and the second electrode pattern 151*e* disposed at another side of the third gate electrode 123*d*. Since the third gate electrode 123*d* crosses over the second portion of the active region 101, an end portion of the first electrode pattern 131*e* at the side of the third gate electrode 123*d* is disposed on the second corner portion 101*b* of the active region 101. The length of the second electrode pattern 151*e* of the fifth test structure 50 is substantially equal to the length of the second electrode 151*d* of the fourth test structure 40 of FIG. 16A. The second electrode pattern 151*e* at another side of the third gate electrode 123*d* is disposed on the device isolation layer 111 but does not overlap with the active patterns 103*a* and 103*b*. The first electrode pattern 131*e* may be electrically connected to a first conductive line 135*e* connected to the first test pad PAD1 of FIG. 1 through a first contact plug 133*e*. The second electrode pattern 151*e* may be electrically connected to a third conductive line 155*e* connected to the second test pad PAD2 of FIG. 1 through a third contact plug 153*e*.

FIG. 18 is a plan view illustrating a test structure of a semiconductor device according to an exemplary embodiment of the inventive concept.

Referring to FIG. 18, the test structure includes a device isolation layer defining an active region 101, active patterns 103 vertically protruding from the semiconductor substrate 100 of the active region 101 and extending in parallel along one direction, and gate electrodes 123 crossing over the active patterns 103.

The active region 101 has first, second, third, fourth and fifth portions having different widths from each other, rounded corner portions 101*a* and 101*b* are disposed at boundaries of the first to fifth portions. For example, the active region 101 includes first corner portions 101*a* reducing an area of the active region 101 and second corner portions 101*b* increasing the area of the active region 101 by the corner rounding phenomenon. The active region 101 has inflection points which are disposed between the first corner portion 101*a* and the second corner portion 101*b* adjacent to each other. The lengths of the active patterns 103 of the first to fifth portions of the active region 101 are different from each other.

The test structure may evaluate variability of the active patterns 103 respectively disposed on the second corner portions 101*b*. For example, a pair of first and second electrode patterns 131*a*, 131*b*, 131*c* or 131*d* and 151*a*, 151*b*, 151*c* or 151*d* is disposed on each of the second corner portions 101*b* with the gate electrode 123 therebetween. The first electrode patterns 131*a* to 131*d* are disposed in the active region 101 when viewed from a plan view, and the second electrode patterns 151*a* to 151*d* are disposed on boundaries between the device isolation 111 and the second corner portions 101*b*, respectively. Here, an end portion of each of the first and second electrode patterns 131*a* to 131*d* and 151*a* to 151*d* is disposed on one active pattern 103 adjacent to the second corner portion 101*b*.

The first electrode patterns 131*a* to 131*d* are connected in common to the first test pad PAD1 of FIG. 1 through first contact plugs 133 and a first conductive line 135. The second electrode patterns 151*a* to 151*d* are connected in common to the second test pad PAD2 of FIG. 1 through third contact plugs 153 and a third conductive line 155. Additionally, the gate electrodes 123 between the first and second electrode patterns 131*a* to 131*d* and 151*a* to 151*d* is connected in common to a gate pad (not shown) to evaluate connectivity of the active patterns 103 extending to the second corner portions 101*b*.

According to an exemplary embodiment of the inventive concepts, it is possible to evaluate an electrical short between the gate electrode and the active patterns, the variability of the active patterns and electrical characteristics of the field effect transistors caused by the corner rounding phenomenon in the semiconductor device including the fin field effect transistors.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   first and second pads disposed on a semiconductor substrate; and
   a plurality of test structures disposed on the semiconductor substrate, wherein each test structure comprises:
   an active region having a rounded corner portion;
   a plurality of active patterns protruding from the semiconductor substrate and extending in parallel in a first direction;
   a plurality of gate electrodes crossing over the active patterns in a second direction, wherein one of the plurality of gate electrodes is electrically connected to the first pad; and
   an electrode pattern disposed at a side of the one of the plurality of gate electrodes, wherein the electrode pattern is electrically connected to the second pad, wherein the electrode pattern crosses over the plurality of active patterns,
   wherein an overlapping area of the electrode pattern and the plurality of active patterns in each test structure is different from an overlapping area of the electrode pattern and the plurality of active patterns in other test structures.

2. The semiconductor device of claim 1, wherein at least one of the plurality of test structures includes the electrode pattern spaced apart from the rounded corner portion.

3. The semiconductor device of claim 2, wherein at least one of the plurality of test structures includes the electrode pattern disposed on the rounded corner portion.

4. The semiconductor device of claim 1, wherein the rounded portion includes a first rounded corner portion, a second rounded corner portion and an inflection point between the first and second rounded corner portions.

5. The semiconductor device of claim 1, wherein the active region includes a first active region having a first width and a second active region having a second width less than the first width,
   wherein the first and second widths are measured in the second direction,
   wherein the plurality of active patterns includes a first active pattern disposed in the first active region and a second active pattern disposed in the second active region, and
   wherein a length of the first active pattern is smaller than a length of the second active pattern.

6. The semiconductor device of claim 1, wherein each test structure further comprises a conductive line and a gate conductive line,
   wherein the electrode pattern is electrically connected through the conductive line to the second pad;
   wherein the one of the plurality of gate electrodes is electrically connected through the gate conductive line to the first pad.

7. The semiconductor device of claim 1, wherein the active region of each test structure is substantially the same in shape and size as other test structures, wherein a number of the plurality of active patterns in each test structure is substantially the same as other test structures, wherein a number of a plurality of gate electrodes in each test structure is substantially the same as other test structures, wherein the one of the plurality of gate electrodes disposed in each test structure and electrically connected to the first pad is disposed at a different position in the active region from other test structures.

* * * * *